US012599046B2

(12) United States Patent (10) Patent No.: US 12,599,046 B2
Park et al. (45) Date of Patent: Apr. 7, 2026

(54) APPARATUS AND METHOD FOR FABRICATING DISPLAY PANEL, AND DISPLAY PANEL

(71) Applicant: Samsung Display Co., LTD., Yongin-si (KR)

(72) Inventors: Sung Kook Park, Yongin-si (KR); Sang Hyun Lee, Yongin-si (KR); Sung Eun Baek, Yongin-si (KR); Tae Hee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 419 days.

(21) Appl. No.: 18/230,065

(22) Filed: Aug. 3, 2023

(65) Prior Publication Data

US 2024/0194653 A1 Jun. 13, 2024

(30) Foreign Application Priority Data

Dec. 13, 2022 (KR) ........................ 10-2022-0173332

(51) Int. Cl.
*H01L 21/68* (2006.01)
*H01L 25/075* (2006.01)
*H01L 25/16* (2023.01)

(52) U.S. Cl.
CPC ........ *H01L 25/0753* (2013.01); *H01L 25/167* (2013.01)

(58) Field of Classification Search
CPC .................... H01L 21/681; H01L 2223/54426
USPC .................................................. 313/498–512
See application file for complete search history.

(56) References Cited

U.S. PATENT DOCUMENTS

| | | | | |
|---|---|---|---|---|
| 2002/0027650 A1* | 3/2002 | Yamamoto | ............. | H05K 3/303 |
| | | | | 356/121 |
| 2016/0123307 A1* | 5/2016 | Drack | ..................... | G01L 11/00 |
| | | | | 73/198 |
| 2016/0247734 A1* | 8/2016 | Fukushima | ........... | H01L 23/544 |
| 2018/0188595 A1* | 7/2018 | Kim | .................. | G02F 1/133514 |
| 2021/0033932 A1* | 2/2021 | Cha | ..................... | G02F 1/13306 |
| 2021/0398960 A1* | 12/2021 | Zhong | ................... | H01L 25/167 |
| 2022/0299448 A1* | 9/2022 | Liu | ..................... | G03F 7/70616 |
| 2023/0259018 A1* | 8/2023 | Kim | ......................... | G03F 1/42 |
| | | | | 430/5 |

FOREIGN PATENT DOCUMENTS

| | | |
|---|---|---|
| KR | 10-0492159 B1 | 6/2005 |
| KR | 10-2019-0105504 A | 9/2019 |
| KR | 10-2022-0112539 A | 8/2022 |

* cited by examiner

*Primary Examiner* — Christopher M Raabe
(74) *Attorney, Agent, or Firm* — Womble Bond Dickinson (US) LLP

(57) ABSTRACT

An apparatus for fabricating a display panel includes: a fixing frame for fixing an outer circumference of a transfer film on which a plurality of light-emitting elements is arranged; an optical inspection member including a light source for irradiating light toward the transfer film and a light-receiving sensor in an optical path of the light source; and an elongation processing member for elongating a width of the transfer film toward an outer circumference thereof and for controlling a degree of elongation based on detection results by the optical inspection member. The light-emitting elements include first light-emitting elements and second light-emitting elements, and the second light-emitting elements include alignment keys on one side.

22 Claims, 35 Drawing Sheets

NEA

FOL

IDK

LE-a

100

LE : LE-a, LE-b

DR3

DR1

DR2

APPARATUS AND METHOD FOR FABRICATING DISPLAY PANEL, AND DISPLAY PANEL

CROSS-REFERENCE TO RELATED APPLICATION

This application claims priority to and the benefit of Korean Patent Application No. 10-2022-0173332, filed on Dec. 13, 2022, in the Korean Intellectual Property Office, the entire disclosure of which is incorporated herein by reference.

BACKGROUND

1. Field

Aspects of embodiments of the present disclosure relate to an apparatus and a method for fabricating a display panel and a display panel.

2. Description of the Related Art

Display devices have become more and more important as multimedia technology evolves. Accordingly, a variety of types of display devices, such as organic light-emitting diode (OLED) display devices and liquid-crystal display (LCD) devices, are currently used.

Display devices generally include a display panel, such as a light-emitting display panel and a liquid-crystal display panel, for displaying image. From among the types of display panels, the light-emitting display panel may include light-emitting diodes (LEDs. Light-emitting diodes may include (or may be) an organic light-emitting diode using an organic material as a luminescent material, an inorganic light-emitting diode using an inorganic material as a luminescent material, etc.

To fabricate a display panel using inorganic light-emitting diodes as light-emitting diodes, apparatuses for transferring micro LEDs onto the substrate of the display panel should be developed.

SUMMARY

Embodiments of the present disclosure provide an apparatus and a method for fabricating a display panel in which light-emitting diodes can be easily formed and arrange.

Embodiments of the present disclosure also provide an apparatus and a method for fabricating a display panel in which light-emitting diodes can be arranged at a desired distance precisely and accurately.

However, aspects and features of the present disclosure are not limited to those explicitly described herein. The above and other aspects and features of the present disclosure will become more apparent to one of ordinary skill in the art to which the present disclosure pertains by referencing the detailed description of the present disclosure given below.

According to an embodiment, an apparatus for fabricating a display panel includes: a fixing frame for fixing an outer circumference of a transfer film on which a plurality of light-emitting elements is arranged; an optical inspection member including a light source for irradiating light toward the transfer film and a light-receiving sensor along (or in) an optical path of the light source; and an elongation processing member for elongating a width of the transfer film toward the outer circumference thereof and for controlling a degree of elongation based on detection results by the optical inspection member. The light-emitting elements include first light-emitting elements and second light-emitting elements, and the second light-emitting elements include alignment keys on one side The elongation processing member may include: a plate-shaped frame on which the transfer film is arranged; and a transfer mechanism for supporting a rear surface of the plate-shaped frame and for moving the plate-shaped frame toward a front side or a rear side of the plate-shaped frame.

The plate-shaped frame may have a through hole extending from one surface to an opposite surface thereof. The optical inspection member may form an optical path on the same axis as the through hole, and the light source and the light-receiving sensor may be arranged with the through hole therebetween.

The elongation processing member may be configured to elongate the transfer film until the second light-emitting elements are on a same axis as the through hole based on inspection results of the optical inspection member.

The apparatus may further include a film mount for fixing a position of the fixing frame during elongation of the transfer film by the elongation processing member by pressing the fixing frame.

Each of the second light-emitting element may have a second semiconductor layer, an active layer, a first semiconductor layer, a connection electrode, and an alignment key sequentially stacked on one another in this order.

The alignment key may have conductivity and a reflectivity higher than that of the connection electrode.

A width of the second light-emitting elements may be equal to or greater than a width of the first light-emitting elements.

The second light-emitting elements may be at least partially surrounded by the first light-emitting elements.

A number of the second light-emitting elements may be less than a number of the first light-emitting elements.

According to an embodiment, a method for fabricating a display panel includes: forming a plurality of light-emitting elements on a base substrate, transferring and attaching the plurality of light-emitting elements to a transfer film; disposing the transfer film on a plate-shaped frame of an elongation processing member by fixing an outer circumference of the transfer film on which the plurality of light-emitting elements is attached with a fixing frame; monitoring an amount of light reflected from the transfer film by an optical inspection member; and elongating a width of the transfer film toward the outer circumference thereof by the elongation processing member while controlling a degree of elongation based on detection results by the optical inspection member. The light-emitting elements include first light-emitting elements and second light-emitting elements, and the second light-emitting elements include alignment keys on one side.

The method may further include: preparing a display substrate including pixel circuits and pixel electrodes; and disposing the light-emitting elements spaced apart from one another by a distance varying according to an elongation amount of the transfer film on the pixel electrodes of the display substrate.

The elongation processing member may elongate the transfer film until the second light-emitting elements are positioned along an optical path of the optical inspection member.

The forming of the light-emitting elements may include forming the first light-emitting elements in each of which a second semiconductor layer, an active layer, a first semiconductor layer, and a connection electrode are sequentially stacked on the base substrate, and forming of the second light-emitting elements in each of which the second semiconductor layer, the active layer, the first semiconductor layer, the connection electrode, and one of the alignment keys are sequentially stacked on the base substrate.

The alignment key may have conductivity and a reflectivity higher than that of the connection electrode.

A width of the second light-emitting elements may be equal to or greater than a width of the first light-emitting elements.

According to an embodiment, a display panel includes: a support substrate including pixel circuits and pixel electrodes; and a plurality of light-emitting elements on the pixel electrodes. The plurality of light-emitting elements includes first light-emitting elements and second light-emitting elements, and the second light-emitting elements include alignment keys on one side thereof.

Each of the second light-emitting element may include a second semiconductor layer, an active layer, a first semiconductor layer, a connection electrode, and one of the alignment keys stacked on one another in this order.

The alignment keys may have conductivity and a reflectivity higher than that of the connection electrode.

A width of the second light-emitting elements may be equal to or greater than a width of the first light-emitting elements.

The second light-emitting elements may be at least partially surrounded by the first light-emitting elements.

A number of the second light-emitting elements may be less than a number of the first light-emitting elements.

In a light-emitting element transfer system according to an embodiment of the present disclosure, a transfer member can be provided by a single system, and light-emitting elements on a transfer film can be transferred onto a circuit board by using the transfer member.

However, aspects and features of the present disclosure are not limited to the aforementioned aspects and features, and various other aspects and features are included in the present specification.

BRIEF DESCRIPTION OF THE DRAWINGS

The above and other aspects and features of the present disclosure will become more apparent by describing, in detail, embodiments thereof with reference to the attached drawings, in which:

FIG. 4 is a cross-sectional view taken along the line A-A' of FIG.

FIG. 16 is a flowchart describing a method for fabricating a display panel by using the apparatus shown in FIG. 8 and.

DETAILED DESCRIPTION

Figure 1:
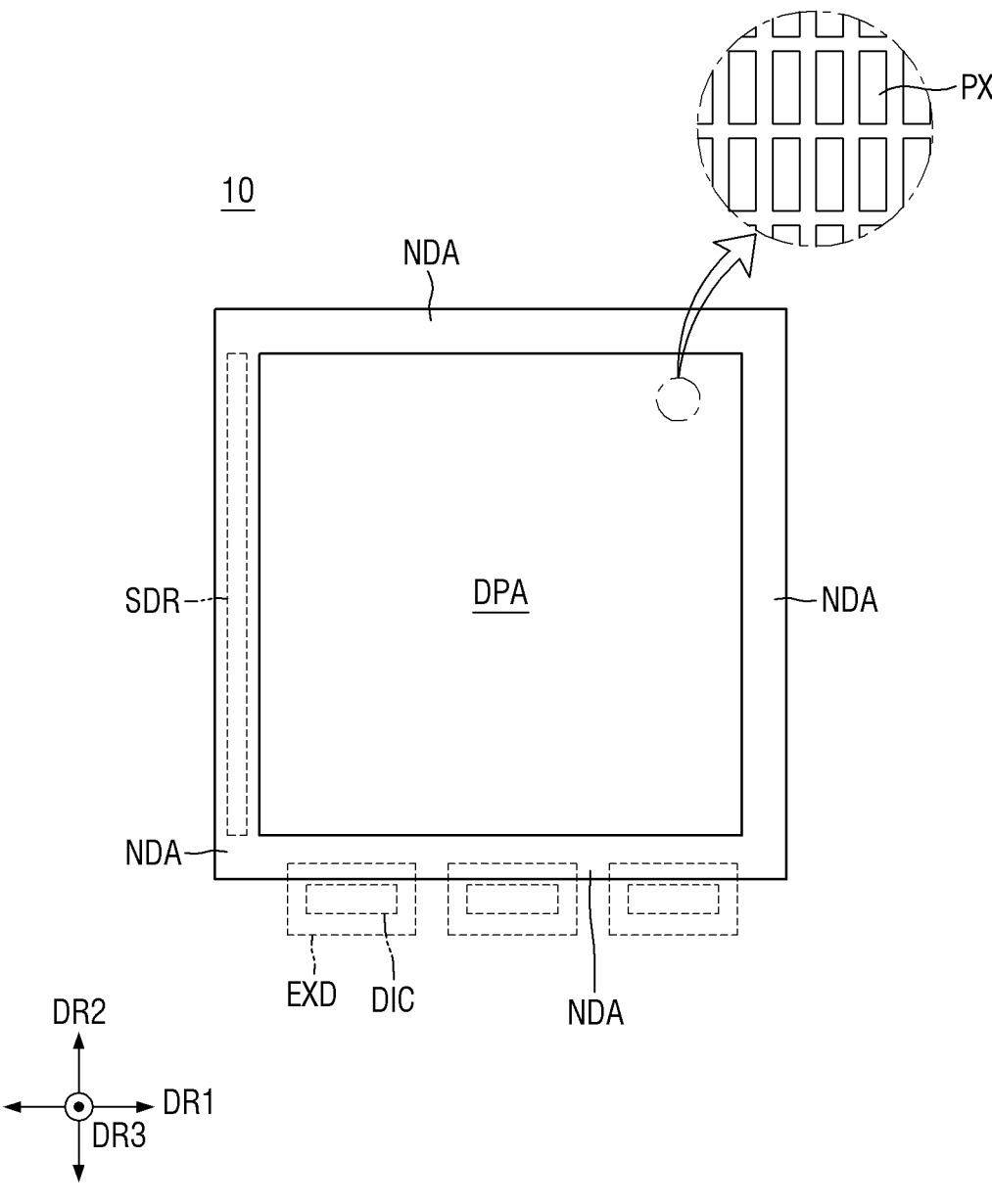
FIG. 1 is a plan view of a display device according to an embodiment of the present disclosure.

Embodiments of the present disclosure will now be described more fully hereinafter with reference to the accompanying drawings. The present disclosure may, however, be provided in different forms and should not be construed as limited to the embodiments described herein.

Some of the parts and/or features of the described embodiments that are not directly associated with the description may be omitted or only briefly described to more clearly describe the embodiments of the present disclosure.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiment.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. When a third object intervenes between a first and second object, the first and second objects may be understood as being indirectly opposed to one another, although still facing each other.

The terms "about" or "approximately" as used herein are inclusive of the stated value and an acceptable range of deviation for the particular value as determined by one of ordinary skill in the art, considering the measurement in question and the error associated with measurement of the particular quantity (e.g., the limitations of the measurement system). For example, "about" may mean within one or more standard deviations or within ±30%, 20%, 10%, 5% of the stated value.

Unless otherwise defined or implied, all terms used herein (including technical and scientific terms) have the same meaning as commonly understood by those skilled in the art to which this disclosure pertain. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments of the present disclosure will be described, in detail, with reference to the accompanying drawing.

FIG. 1 is a plan view of a display device according to an embodiment of the present disclosure.

Referring to FIG. 1, a display device 10 according to an embodiment of the present disclosure may be applied to, for example, a smart phone, a mobile phone, a tablet PC, a personal digital assistant (PDA), a portable multimedia player (PMP), a television set, a game machine, a wrist-watch-type electronic device, a head-mounted display, a personal computer monitor, a laptop computer, a car navigation system, a car instrument cluster, a digital camera, a camcorder, an outdoor billboard, an electronic billboard, various medical apparatuses, various home appliances, such as a refrigerator and a laundry machine, Internet of Things (IOT) devices, et. In the following description, a television is described as an example of the display device 1. The television may have a high resolution or ultra-high resolution, such as HD, UHD, 4K, and 8K.

The display device 10, according to embodiments, may be variously classified by the way in which images are displayed. For example, the display device 10 may be classified as an organic light-emitting diode (OLED) display device, an inorganic light-emitting display device (inorganic EL), a quantum-dot light-emitting display device (QED), a micro LED display device (micro-LED), a nano LED display device (nano-LED), a plasma display device (PDP), a field emission display device (FED) and a cathode ray display device (CRT), a liquid-crystal display device (LCD), an electrophoretic display device (EPD), etc. In the following description, a micro LED display device will be described as an example of the display device 1. The micro LED display device will be referred to herein as simply a display device unless it is necessary to discern them. It should be understood, however, that the present disclosure is not limited to the micro LED display devices, and any other display device listed above or well known in the art may be employed without departing from the scope of the present disclosure.

In addition, in the drawings, a first direction DR1 refers to the horizontal direction of a display device 10, a second direction DR2 refers to the vertical direction of the display device 10, and a third direction DR3 refers to the thickness direction of the display device 10. As used herein, the terms "left," "right," "upper," and "lower" sides indicate relative positions when the display device 10 is viewed from the top (e.g., from the front. For example, the right side refers to one side in the first direction DR1, the left side refers to the other side in the first direction DR1, the upper side refers to one side in the second direction DR2, and the lower side refers to the other side in the second direction DR2. In addition, the upper portion refers to the side indicated by the arrow of the third direction DR3, while the lower portion refers to the opposite side in the third direction DR.

According to an embodiment of the present disclosure, the display device 10 may have a circular, elliptical or quadrangular shape (e.g., a square shape) when viewed from the top. When the display device 10 is a television, it may have a rectangular shape in which the longer sides extend in the horizontal direction. It should be understood, however, that the present disclosure is not limited thereto. The longer side may extend in the vertical direction. In some cases, the display device 10 may be rotatably installed so that the longer sides can variably extend in the horizontal or vertical direction according to the rotation of the display device 10.

The display device 10 may have a display area DPA and a non-display area ND. The display area DPA may be an active area at where images are displayed. The display area DPA may have, but is not limited to, a square shape similar to the general shape of the display device 10 when viewed from the to. In other embodiments, the display area DPA may have a circular shape or an elliptical shape.

The display area DPA may include a plurality of pixels P. The plurality of pixels PX may be arranged in a matrix. The shape of each of the pixels PX may be, but is not limited to, a rectangle or a square when viewed from the to. Each of the pixels PX may have a diamond shape having sides inclined with respect to a side of the display device 1. The plurality of pixels PX may include different color pixels P. For example, the plurality of pixels PX may include, but is not limited to, a red first color pixel PX, a green second color pixel PX, and a blue third color pixel P. The stripe-type pixels and Pentile®-type (a registered trademark of Samsung Display Co., Ltd.) pixels may be alternately arranged.

The non-display area NDA may be disposed (or arranged) around the display area DP. The non-display area NDA may entirely or partially surround (e.g., may surround in a plan view or may extend around a periphery of) the display area DPA. The display area DA may have a variety of shapes such as a circle and a square. For example, the non-display area NDA may form the bezel of the display device 1.

A driving circuit or a driving element for driving the display area DPA may be disposed in the non-display areas ND. According to an embodiment of the present disclosure, pad areas may be located on the display substrate of the display device 10 in the non-display area NDA adjacent to a first side (e.g., the lower side in FIG. 1) of the display device 10, and external devices EXD may be mounted on pad electrodes in the pad area. Examples of the external devices EXD may include a connection film, a printed circuit board, a driver chip DIC, a connector, a line connection film, etc. A scan driver SDR formed directly on the display substrate of the display device 10 or the like may be disposed in the non-display area NDA adjacent to a second side (e.g., the left side in FIG. 1) of the display device 10.

Figure 2:
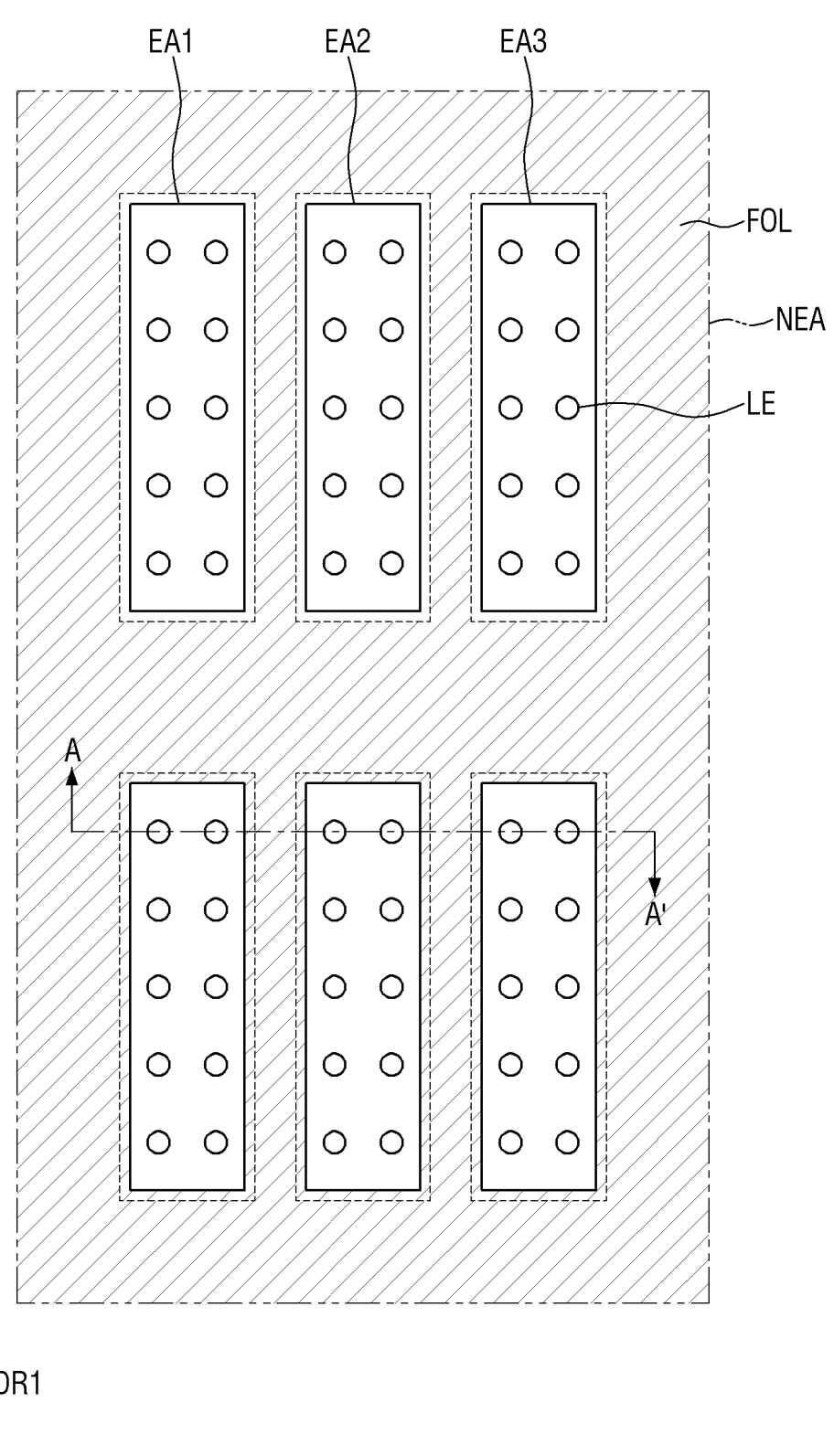
FIG. 2 is a plan view schematically showing emission areas of pixels according to an embodiment.

FIG. 2 is a plan view schematically showing emission areas of pixels according to an embodiment.

Referring to FIG. 2, the plurality of pixels PX may be arranged in a matrix, and the plurality of pixels PX may be (e.g., may sorted into) a first color pixel PX for emitting red color, a second color pixel PX for emitting green color, and a third color pixel PX for emitting blue color In addition, a fourth color pixel PX for emitting white color may be further included.

The pixel electrode of the first color pixel PX may be disposed in a first emission area EA1 and may extended at least partially to a non-emission area NEA. The pixel electrode of the second color pixel PX may be disposed in a second emission area EA2 and may extend at least partially to the non-emission area NEA. The pixel electrode of the third color pixel PX may be disposed in a third emission area EA3 and may extend at least partially to the non-emission area NEA. The pixel electrode of each of the pixels PX may pass through at least one insulating layer to be connected with one switching element included in the respective pixel circuit.

A plurality of light-emitting elements LE are disposed on the pixel electrode of the first emission area EA1, the pixel electrode of the second emission area EA2, and the pixel electrode of the third emission area EA3. For example, the light-emitting elements LE are disposed in each of the first emission area EA1, the second emission area EA2, and the third emission area EA3. In addition, a red first color filter, a green second color filter, and blue third color filter may be disposed on the first emission area EA1, the second emission area EA2, and the third emission area EA3, respectively, in which the plurality of light-emitting elements LE is dispose. A first organic layer FOL may be disposed in the non-emission area NE.

Figure 3:
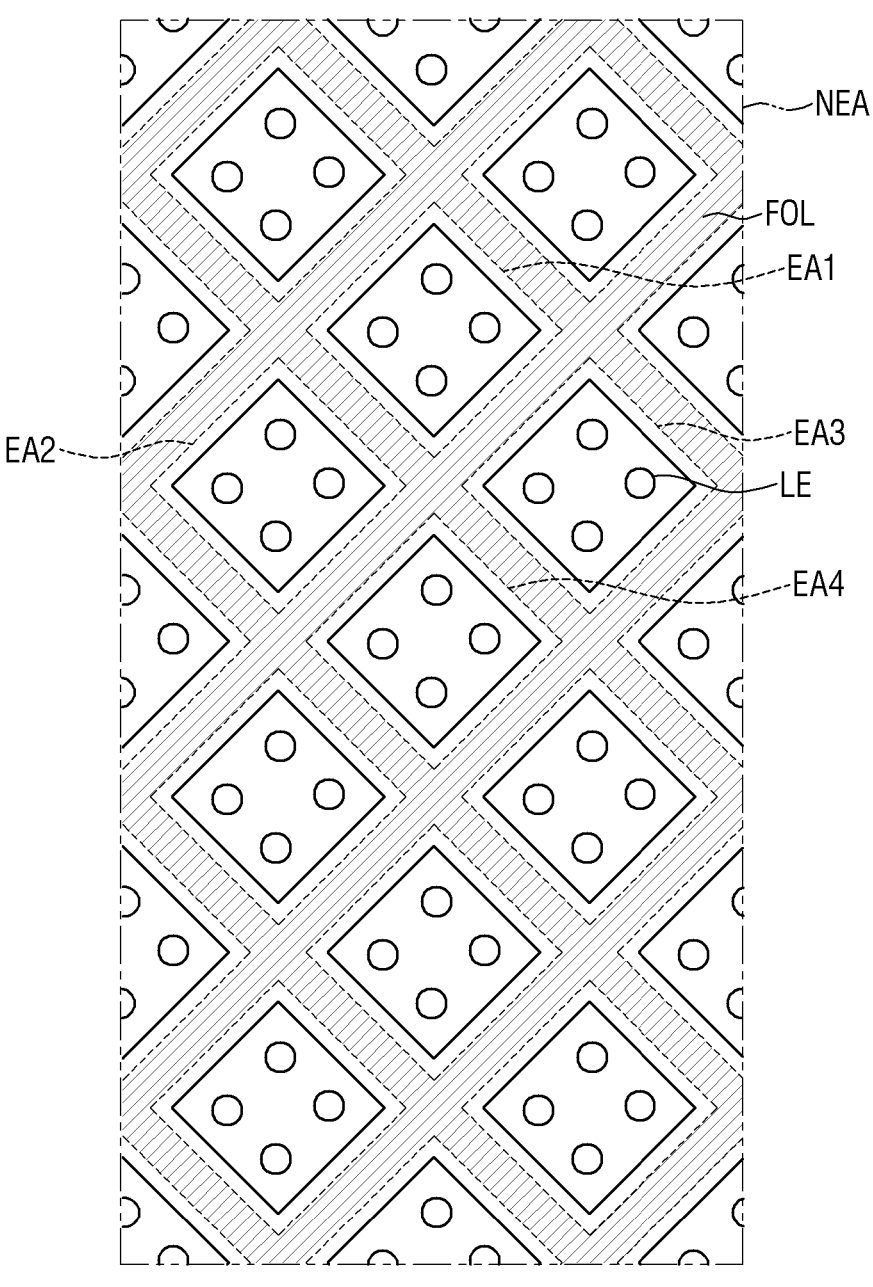
FIG. 3 is a plan view schematically showing emission areas of pixels according to another embodiment.
Figure 3:
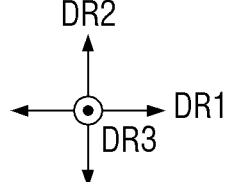

FIG. 3 is a plan view schematically showing emission areas of pixels according to another embodiment.

Referring to FIG. 3, the shape of the pixels PX is not limited to a rectangular or square shape when viewed from the top but may be a diamond shape in which the sides are inclined with respect to one side of the display device 10 to form a PenTile® (or diamond) matrix. Accordingly, in the pixels PX arranged in the PenTile® matrix, the first emission area EA1 of the first color pixel PX, the second emission area EA2 of the second color pixel PX, the third emission area EA3 of the third color pixel PX, and the fourth emission area EA4 of the pixel PX of one of the first to third colors may be formed in a diamond shape.

The first to fourth emission areas EA1 to EA4 of the pixels PX may have the same size or area or different sizes or areas. Likewise, the numbers of light-emitting elements LE formed in the first to fourth emission areas EA1 to EA4 may be all equal or different from one another.

The area of the first emission area EA1, the area of the second emission area EA2, the area of the third emission area EA3, and the area of the fourth emission area EA4 may be substantially equal. The present disclosure, however, is not limited thereto, and the areas of the first to fourth emissions areas EA1 to EA4 may be different from one another. The distance between the first emission area EA1 and the second emission area EA2 adjacent to each other, the distance between the second emission area EA2 and the third emission area EA3 adjacent to each other, the distance between the first emission area EA1 and the third emission area EA3 adjacent to each other, and the distance between the third emission area EA3 and the fourth emission area EA4 may be substantially equal or may be different from one another. The present disclosure is not limited any particular arrangement, however.

In addition, the first emission area EA1 may emit a first light, the second emission area EA2 may emit a second light, and the third emission area EA3 and the fourth emission area EA4 may emit a third light. It should be understood, however, that the present disclosure is not limited thereto. For example, the first emission area EA1 may emit the second light, the second emission area EA2 may emit the first light, and the third and fourth emission areas EA3 and EA4 may emit the third light. In some embodiments, the first emission area EA1 may emit the third light, the second emission area EA2 may emit the second light, and the third and fourth emission areas EA3 and EA4 may emit the first light. In some embodiments, at least one of the first to fourth emission areas EA1 to EA4 may emit the fourth light. The fourth light may be light in a yellow wavelength rang. For example, the main peak wavelength of the fourth light may be in a range of approximately 550 nm to approximately 600 nm but the present disclosure is not limited thereto.

Figure 4:
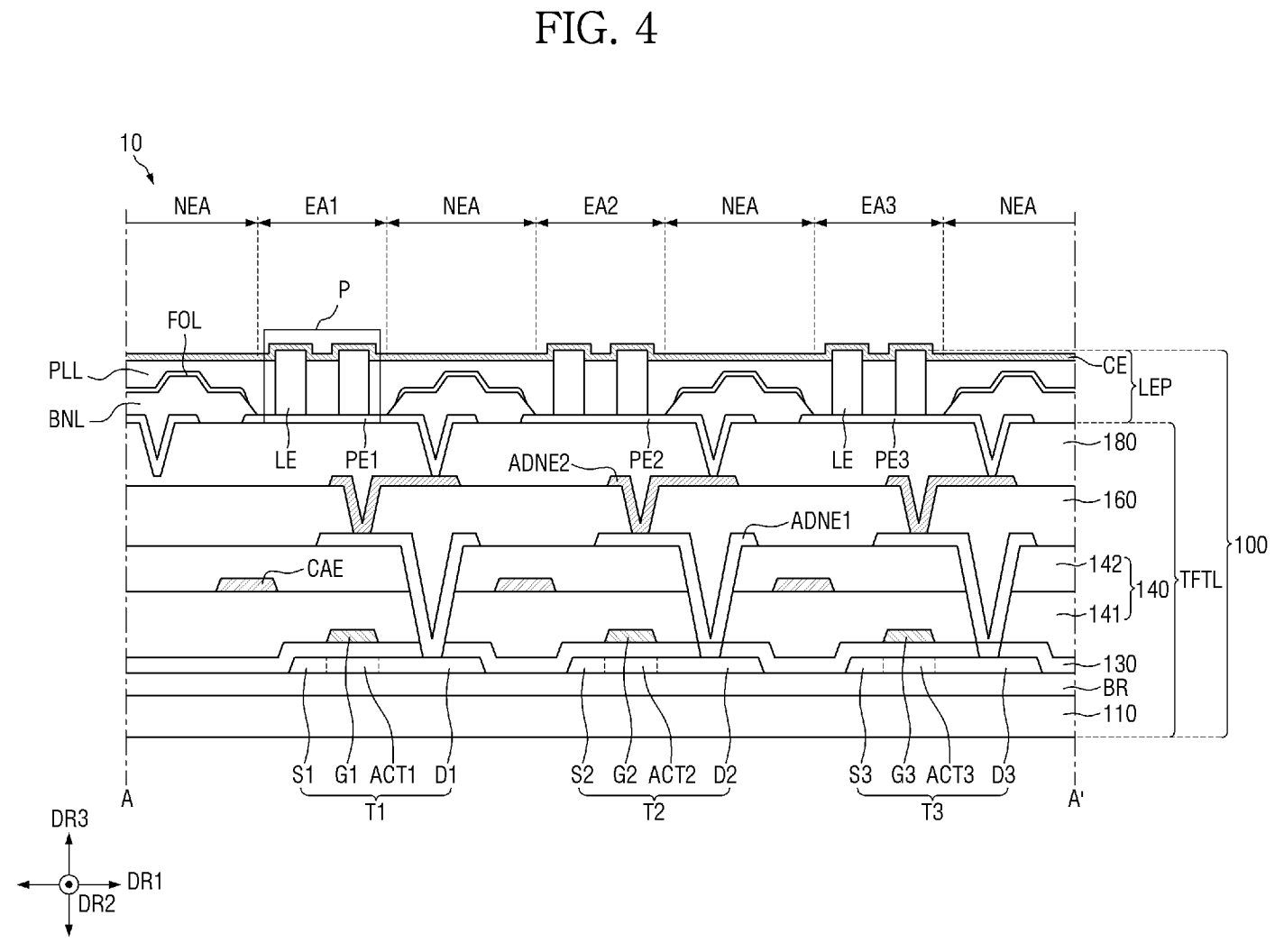
Figure 5:
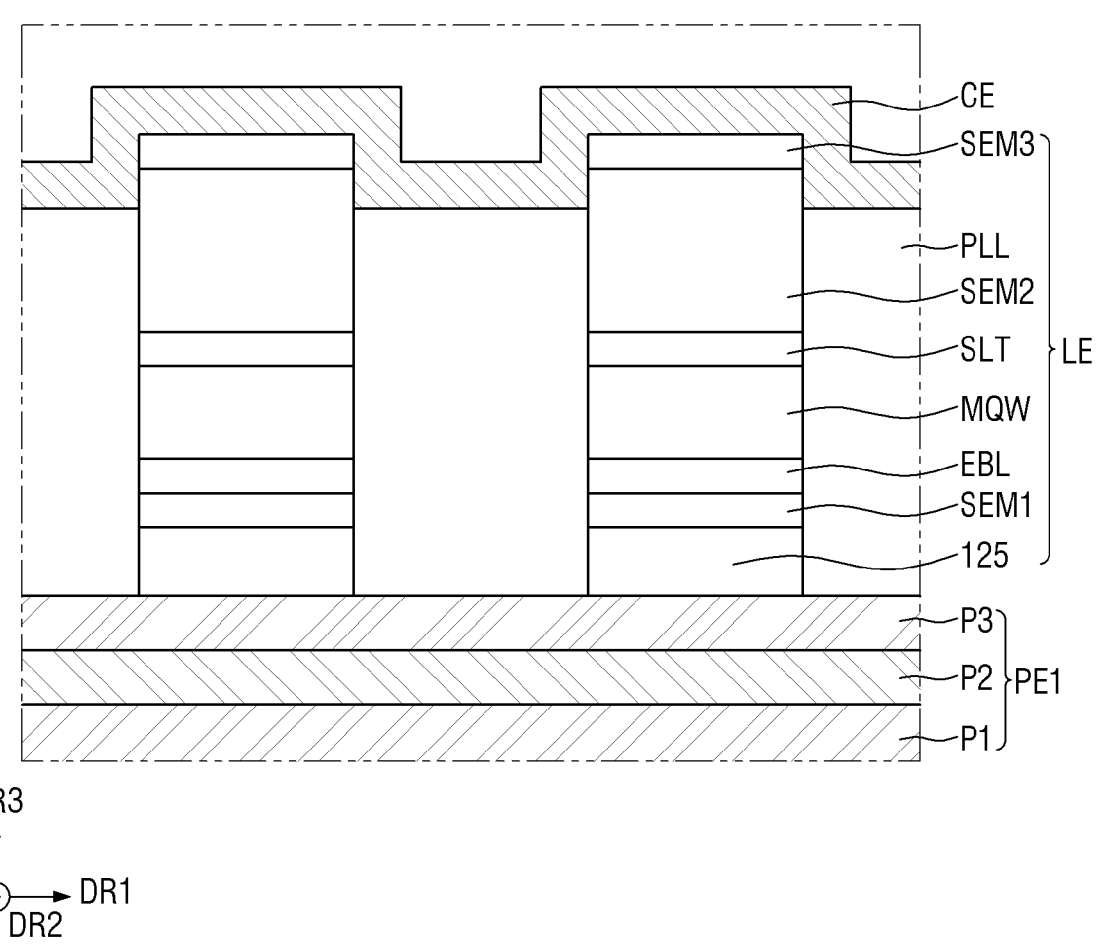
FIG. 5 is an enlarged view schematically showing the area P of FIG.

FIG. 4 is a cross-sectional view taken along the line A-A of FIG. FIG. 5 is an enlarged view schematically showing the area P of FIG. 4.

Referring to FIGS. 4 and 5, the display substrate 100 of the display device 10 may include a support substrate 110, a thin-film transistor layer TFTL disposed on the support substrate 110, and a light-emitting element portion LE.

The support substrate 110 may be an insulating substrate. The support substrate 110 may include a transparent material. For example, the support substrate 110 may include a transparent insulating material, such as glass and quart. The support substrate 110 may be a rigid substrate. However, the present disclosure is not limited thereto, and the support substrate 110 may include a plastic, such as polyimide, and may be flexible so that it can be curved, bent, folded, or rolled. The support substrate 110 may have a plurality of emission areas EA1, EA2, and EA3 and a non-emission area NEA.

According to an embodiment, the thin-film transistor layer TFTL may include thin-film transistors TFT including amorphous silicon, polysilicon, or an oxide semiconductor and an insulating layer 18. The thin-film transistor layer TFTL may further include a plurality of signal lines (e.g., gate lines, data lines, power lines, etc.) for transmitting signals to the thin-film transistors TFT.

The insulating layer 180 may be disposed on the thin-film transistors TF. The insulating layer 180 may be a planarization layer and may include an organic material. For example, the insulating layer 180 may include an acrylic resin, an epoxy resin, an imide resin, an ester resin, et. According to an embodiment of the present disclosure, the insulating layer 180 may include a positive photosensitive material or a negative photosensitive material.

The light-emitting element portion LEP may be disposed on the insulating layer 18. The light-emitting element portion LEP may include a plurality of pixel electrodes PE1, PE2, and PE3, a plurality of light-emitting elements LE, and a common electrode C.

The plurality of pixel electrodes PE1, PE2, and PE3 may include a first pixel electrode PE1, a second pixel electrode PE2, and a third pixel electrode PE. The first pixel electrode PE1, the second pixel electrode PE2, and the third pixel electrode PE3 may act as (or may be referred to as) a first electrode of the light-emitting element LE and may be an anode electrode or a cathode electrode. The first pixel electrode PE1 may be disposed in the first emission area EA1 and may at least partially extend to the non-emission area NEA. The second pixel electrode PE2 may be disposed in the second emission area EA2 and may at least partially extend to the non-emission area NEA. The third pixel electrode PE3 may be disposed in the third emission area EA3 and may at least partially extend to the non-emission area NEA. Each of the plurality of pixel electrodes PE1, PE2, and PE3 may penetrate (e.g., may extend through) the insulating layer 180 to be connected to the thin-film transistors TF.

The first pixel electrode PE1, the second pixel electrode PE2, and the third pixel electrode PE3 may be reflective electrode. The first pixel electrode PE1, the second pixel electrode PE2, and the third pixel electrode PE3 may include a plurality of films including a material layer having a high work function, such as titanium oxide (e.g., $TiO_2$), ITO (indium tin oxide), IZO (indium zinc oxide), ZnO (zinc oxide), ITZO (indium tin zinc oxide), or MgO (magnesium oxide), and a reflective material layer including silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof are stacked on one another. A material layer having a higher work function may be disposed higher than (or above) the reflective material layer so that it may be nearer to the light-emitting element L. The first pixel electrode PE1, the second pixel electrode PE2, and the third pixel electrode PE3 may have, for example, a multilayer structure of ITO/Mg, ITO/MgF, ITO/Ag, and ITO/Ag/IT.

A bank BNL may be formed on the first pixel electrode PE1, the second pixel electrode PE2, and the third pixel electrode PE. The bank BNL may have an opening exposing the first pixel electrode PE1, an opening exposing the second pixel electrode PE2, and an opening exposing the third pixel electrode PE3 and may define the first emission area EA1, the second emission area EA2, the third emission area EA3, and the non-emission area NE. For example, an area of the first pixel electrode PE1 that is not covered by the bank BNL and is exposed therethrough may be the first emission area EA. An area of the second pixel electrode PE2 that is not covered by the bank BNL and is exposed therethrough may be the second emission area EA. An area of the third pixel electrode PE3 that is not covered by the bank BNL and is exposed therethrough may be the third emission area EA. The other areas at where the bank BNL is formed may be the non-emission area NEA.

The bank BNL may include an organic insulating material, such as a polyacrylate resin, an epoxy resin, a phenolic resin, a polyamide resin, a polyimide resin, an unsaturated polyester resin, a polyphenylene ether resin, a poly phenylene sulfide resin, and benzocyclobutene (BCB).

A plurality of light-emitting elements LE may be disposed on the first pixel electrode PE1, the second pixel electrode PE2, and the third pixel electrode PE.

As shown in FIGS. 4 and 5, the light-emitting elements LE may be disposed in each of the first emission area EA1, the second emission area EA2, and the third emission area EA3. Each of the light-emitting elements LE may be a vertical light-emitting diode extending in (e.g., primarily extending in) the third direction DR. For example, the length of the light-emitting element LE in the third direction DR3 may be greater than the length thereof in the horizontal direction. The horizontal length refers to either the length in the first direction DR1 or the length in the second direction DR. For example, the length of the light-emitting element LE in the third direction DR3 may be in a range of approximately 1 μm to approximately 5 μm.

Each of the light-emitting elements LE may be a micro light-emitting diode. Referring to FIG. 5, the light-emitting element LE may include a connection electrode 125, a first semiconductor layer SEM1, an electron blocking layer EBL, an active layer MQW, a superlattice layer SLT, a second semiconductor layer SEM2, and a third semiconductor layer SEM3 in the thickness direction of the display substrate 100 (e.g., in the third direction DR3. The connection electrode 125, the first semiconductor layer SEM1, the electron blocking layer EBL, the active layer MQW, the superlattice layer SLT, the second semiconductor layer SEM2, and the third semiconductor layer SEM3 may be stacked on one another in this order in the third direction DR.

The light-emitting elements LE may have a cylindrical shape, a disk shape, or a rod shape having a greater width than height. It should be understood, however, that the present disclosure is not limited thereto. The light-emitting element LE may have a shape of a rod, wire, tube, etc., a shape of a polygonal column, such as a cube, a cuboid, and a hexagonal column, or may have a shape extending in a direction with a partially inclined outer surface.

The connection electrode 125 may be disposed on each of the plurality of pixel electrodes PE1, PE2, and PE. In the following description, an embodiment in which the light-emitting elements LE is disposed on the first pixel electrode PE1 is described as an example.

The connection electrode 125 may be in contact with the first pixel electrode PE1 to apply an emission signal to the light-emitting elements L. The connection electrode 125 may be an ohmic connection electrode. The present disclosure, however, is not limited thereto, and the connection electrode 125 may be a Schottky connection electrode. The light emitting element LE may include at least one connection electrode 12. Although each of the light-emitting elements LE includes one connection electrode 125 in the example shown in FIG. 5, the present disclosure is not limited thereto. In some embodiments, the light-emitting elements LE may include a greater number of connection electrodes 125 or may not include any connection electrodes 125. The following description of the light-emitting elements LE may be equally applied even when the number of connection electrodes 125 is different or they further include other layers or structures.

The connection electrodes 125 can reduce the resistance between the light-emitting elements LE and the first pixel electrode PE1 and can improve the adhesion therebetween when the light-emitting elements LE are electrically connected to the first pixel electrode PE1 in the display device 10 according to an embodiment of the present disclosure. The connection electrodes 125 may include a metal oxide having conductivity. For example, the connection electrodes 125 may be IT. Because the connection electrode 125 is in direct contact with and connected to the first pixel electrode PE1 thereunder, it may be made of the same material as the first pixel electrode PE. Accordingly, the adhesion between the connection electrode 125 and the first pixel electrode PE1 can be increased so that the contact characteristic therebetween can be increased.

Referring to FIG. 5, the first pixel electrode PE1 may include a lower electrode layer P1, a reflective layer P2, and an upper electrode layer P3. The lower electrode layer P1 may be disposed at the bottom of the first pixel electrode PE1 and may be electrically connected to the switching element. The lower electrode layer P1 may include a metal oxide, for example, titanium oxide (e.g., $TiO_2$), indium tin oxide (ITO), indium zinc oxide (IZO), zinc oxide (ZnO), indium tin zinc oxide (ITZO), or magnesium oxide (MgO).

The reflective layer P2 may be disposed on the lower electrode layer P1 to reflect light emitted from the light-emitting element LE upwardly. The reflective layer P2 may include a metal having a high reflectance, for example, silver (Ag), magnesium (Mg), aluminum (Al), platinum (Pt), lead (Pb), gold (Au), nickel (Ni), neodymium (Nd), iridium (Ir), chrome (Cr), lithium (Li), calcium (Ca), or a mixture thereof.

The upper electrode layer P3 may be disposed on the reflective layer P2 and may be in direct contact with the light-emitting element L. The upper electrode layer P3 may be disposed between the reflective layer P2 and the connection electrodes 125 of the light-emitting elements LE and may be in direct contact with the connection electrodes 12. As described above, the connection electrodes 125 may be made of a metal oxide, and the upper electrode layer P3 may also be made of a metal oxide similar to the connection electrodes 125. The upper electrode layer P3 may include, for example, titanium oxide (e.g., $TiO_2$), indium tin oxide (ITO), indium zinc oxide (IZO), zinc oxide (ZnO), indium tin zinc oxide (ITZO), or magnesium oxide (MgO. According to an embodiment of the present disclosure, when the connection electrode 125 is made of ITO, the first pixel electrode PE1 may be made up of a multi-layer structure of ITO/Ag/ITO.

The first semiconductor layer SEM1 may be disposed on the connection electrode 12. The first semiconductor layer SEM1 may be p-type semiconductor and may include a semiconductor material having the following chemical formula: $Al_xGa_yIn_{1-x-y}N$ ($0 \leq x \leq 1$, $0 \leq y \leq 1$, and $0 \leq x+y \leq 1$). The first semiconductor layer SEM1 may be doped with a p-type dopant, and the p-type dopant may be Mg, Zn, Ca, Se, Ba, et. For example, the first semiconductor layer SEM1 may be at least one of p-type doped AlGaInN, GaN, AlGaN, InGaN, AlN and In. In one embodiment, the first semiconductor layer SEM1 may be p-GaN doped with p-type M. The thickness of the first semiconductor layer SEM1 may be in a of range from about 30 nm to about 200 nm but is not limited thereto.

The electron blocking layer EBL may be disposed on the first semiconductor layer SEM. The electron blocking layer EBL may suppress or prevent too many electrons from flowing into the active layer MQW. For example, the electron blocking layer EBL may be p-AlGaN doped with p-type M. The thickness of the electron blocking layer may be in a range of about 10 nm to about 50 nm, but the present disclosure is not limited thereto. In some embodiments, the electron blocking layer EBL may be omitted.

The active layer MQW may be disposed on the electron blocking layer EB. The active layer MQW may emit light as electron-hole pairs are combined therein in response to an electrical signal applied through the first semiconductor layer SEM1 and the second semiconductor layer SEM2. The active layer MQW may emit first light having a central wavelength range of about 450 nm to about 495 nm, that is, it may emit light of the blue wavelength rang.

The active layer MQW may include a material having a single or multiple quantum well structure. When the active layer MQW includes a material having the multiple quantum well structure, well layers and barrier layers may be alternately stacked on one another. The well layers may be made of InGaN, and the barrier layers may be made of GaN or AlGaN, but the present disclosure is not limited thereto. The thickness of the well layers may be in a range of approximately 1 nm to approximately 4 nm, and the thickness of the barrier layers may be in a range of approximately 3 nm to approximately 10 n.

In other embodiments, the active layer MQW may have a structure in which a semiconductor material having a large band gap energy and a semiconductor material having a small band gap energy are alternately stacked on one another and may include other Group Ill to Group V semiconductor materials depending on the wavelength range of the light to be emitted. The light emitted by the active layer MQW is not limited to the first light. In some implementations, the active layer MQW may emit the second light (e.g., light in the green wavelength range) or the third light (e.g., light in the red wavelength range).

The superlattice layer SLT may be disposed on the active layer MQW. The superlattice layer SLT may relieve stress between the second semiconductor layer SEM2 and the active layer MQW. For example, the superlattice layer SLT may be made of InGaN or Ga. The thickness of the super-lattice layer SLT may be in a range of approximately 50 nm to approximately 200 n. In some embodiments, the super-lattice layer SLT may be omitted.

The second semiconductor layer SEM2 may be disposed on the superlattice layer SL. The second semiconductor layer SEM2 may be an n-type semiconductor. The second semiconductor layer SEM2 may include a semiconductor material having the following chemical formula: $Al_xGa_yIn_{1-x-y}N$ ($0 \leq x \leq 1$, $0 \leq y \leq 1$, $0 \leq x+y \leq 1$. The second semiconductor layer SEM2 may be doped with an n-type dopant, and the n-type dopant may be Si, Ge, Sn, et. For example, the second semiconductor layer SEM2 may be at least one of n-type doped AlGaInN, GaN, AlGaN, InGaN, AlN and In. In one embodiment, the second semiconductor layer SEM2 may be n-GaN doped with n-type Si. The thickness of the second semiconductor layer SEM2 may be in a range of, about 2 μm to about 4 μm but is not limited thereto.

The third semiconductor layer SEM3 may be disposed on the second semiconductor layer SEM. The third semicon-ductor layer SEM3 may be disposed between the second semiconductor layer SEM2 and the common electrode C. The third semiconductor layer SEM3 may be an undoped semiconductor. The third semiconductor layer SEM3 may include the same material as the second semiconductor layer SEM2 but may not be doped with an n-type or p-type dopant. In an embodiment, the third semiconductor layer SEM3 may be, but is not limited to, at least one of undoped InAlGaN, GaN, AlGaN, InGaN, AlN, and In.

A planarization layer PLL may be disposed on the bank BNL and the plurality of pixel electrodes PE1, PE2 and PE. The planarization layer PLL may provide a flat surface so that a common electrode CE, which will be described later, may be formed (e.g., may be continuously formed. The planarization layer PLL may be formed to have a height (e.g., a predetermined height) so that at least a part, for example, an upper portion of the plurality of light-emitting elements LE, may protrude above the planarization layer PL. For example, the height of the planarization layer PLL from the upper surface of the first pixel electrode PE1 may be less than the height of the light-emitting elements LE from the upper surface of the first pixel electrode PE.

The planarization layer PLL may include an organic material to provide a flat surface. For example, the planar-ization layer PLL may include a polyacrylate resin, an epoxy resin, a phenolic resin, a polyamide resin, a polyimide resin, an unsaturated polyester resin, a polyphenylene ether resin, a poly phenylene sulfide resin, benzocyclobutene (BCB), et.

The common electrode CE may be disposed on the planarization layer PLL and the plurality of light-emitting elements L. For example, the common electrode CE may be disposed on one surface of the support substrate 110 on which the light-emitting elements LE are formed and may be disposed entirely on (e.g., continuously on) the display area DA and the non-display area ND. The common electrode CE may be disposed to overlap the emission areas EA1, EA2, and EA3 in the display area DPA and may have a relatively small thickness to allow light to pass therethrough.

The common electrode CE may be disposed directly on upper and side surfaces of the plurality of light-emitting elements L. The common electrode CE may be in direct contact with the second semiconductor layer SEM2 and the third semiconductor layer SEM3 from among side surfaces of the light-emitting elements L.

As shown in FIGS. 4 and 5, the common electrode CE may be a common layer that covers the plurality of light-emitting elements LE and commonly connects the plurality of light-emitting elements LE with one another. Because the conductive second semiconductor layer SEM2 has a pat-terned structure in each of the light-emitting elements LE, the common electrode CE may be in direct contact with the side surfaces of the second semiconductor layer SEM2 of each of the light-emitting elements LE so that a common voltage can be applied to each of the light-emitting elements L.

Because the common electrode CE is disposed entirely on the support substrate 110 to apply the common voltage, the common electrode CE may include a material having a low resistance. In addition, the common electrode CE may be formed to have a small thickness to allow light to pass therethrough. For example, the common electrode CE may include a material having a low resistance, such as alumi-num (Al), silver (Ag), and copper (Cu. The thickness of the common electrode CE may be in a range of approximately 10 Å to approximately 200 Å but is not limited thereto.

Each of the above-described light-emitting elements LE may receive a pixel voltage or an anode voltage from the pixel electrode through the connection electrode 125 and may receive a common voltage through the common elec-trode C. The light-emitting element LE may emit light with a luminance (e.g., a predetermined voltage) according to a voltage difference between the pixel voltage and the com-mon voltage.

According to an embodiment, by disposing a plurality of light-emitting elements LE (e.g., inorganic light-emitting diodes) on the pixel electrodes PE1, PE2, and PE3, the disadvantages of organic light-emitting diodes, which are vulnerable to external moisture or oxygen may be avoided and the lifetime and the reliability of the organic light-emitting diodes may be improved.

The first organic layer FOL may be disposed on the bank BNL disposed in the non-emission area NE.

The first organic layer FOL may overlap with the non-emission area NEA but not with the emission areas EA1, EA2 and EA. The first organic layer FOL may be disposed directly on the bank BNL and may be spaced apart from a plurality of pixel electrodes PE1, PE2, and PE3 adjacent thereto. The first organic layer FOL may be disposed entirely on the support substrate 110 and may surround (e.g., may surround in a plan view or may extend around a periphery of) the plurality of emission areas EA1, EA2, and EA3. The first organic layer FOL may be disposed generally in a lattice shape.

The first organic layer FOL may act to detach the plurality of light-emitting elements LE in contact with the first organic layer FOL, which is the non-emission area NEA, as will be described in more detail with respect to the process-ing steps of fabricating the first organic layer FOL, to be described late. When the first organic layer FOL is irradiated with laser light, it absorbs energy and its temperature is instantaneously increase so that it is ablate. Accordingly, the plurality of light-emitting elements LE in contact with the upper surface of the first organic layer FOL may be detached from the upper surface of the first organic layer FOL.

The first organic layer FOL may include a polyimide compound. The polyimide compound of the first organic layer FOL may include a cyano group to absorb light having a wavelength of about 308 nm, for example, laser light. In an embodiment, each of the first organic layer FOL and the bank BNL may include a polyimide compound. The polyimide compound of one of them may be different from that of the other one. For example, the bank BNL may be formed of a polyimide compound not including a cyano group, and the first organic layer FOL may be formed of a polyimide compound including a cyano group. The transmittance of the first organic layer FOL for laser light having the wavelength of about 308 nm may be less than the transmittance of the bank BNL. For example, the transmittance of the bank BNL may be approximately 60% or more, and the transmittance of the first organic layer FOL may be approximately 0. The absorption rate of the first organic layer FOL with respect to the laser light having a wavelength of 308 nm may be approximately 100. The first organic layer FOL may have a thickness in a range from approximately 2 Å to approximately 10μ. When the thickness of the first organic layer FOL is approximately 2 Å or more, the absorption rate of the laser light having a wavelength of 308 nm can be improve. When the thickness of the first organic layer FOL is approximately 10 μm or less, a level difference between the first organic layer FOL and the pixel electrode PE1 may not be increased so that the light-emitting elements LE can be easily formed on the pixel electrode in a process to be described later.

The process of fabricating the display device 10 described with reference to FIGS. 1 to 5 may include a process of transferring the light-emitting elements LE grown on a wafer to the first substrate 110 of the display device 10.

In the transfer process, the plurality of light-emitting elements LE grown on the wafer may be transferred to a transfer film formed of a polymer film and, thus, having stretchability. Then, the distance between the light-emitting elements LE may be adjusted by elongating the transfer fil. Subsequently, the light-emitting elements LE on the elongated transfer film may be transferred to the first substrate 110 of the display device 10, such that the display device 10 may be complete.

In doing so, the elongation rate of the transfer film must be controlled to accurately arrange the light-emitting elements LE on the transfer film at a desired distance.

The elongation apparatus, according to an embodiment, is configured to easily and accurately control the elongation rate of the transfer film.

Figure 6:
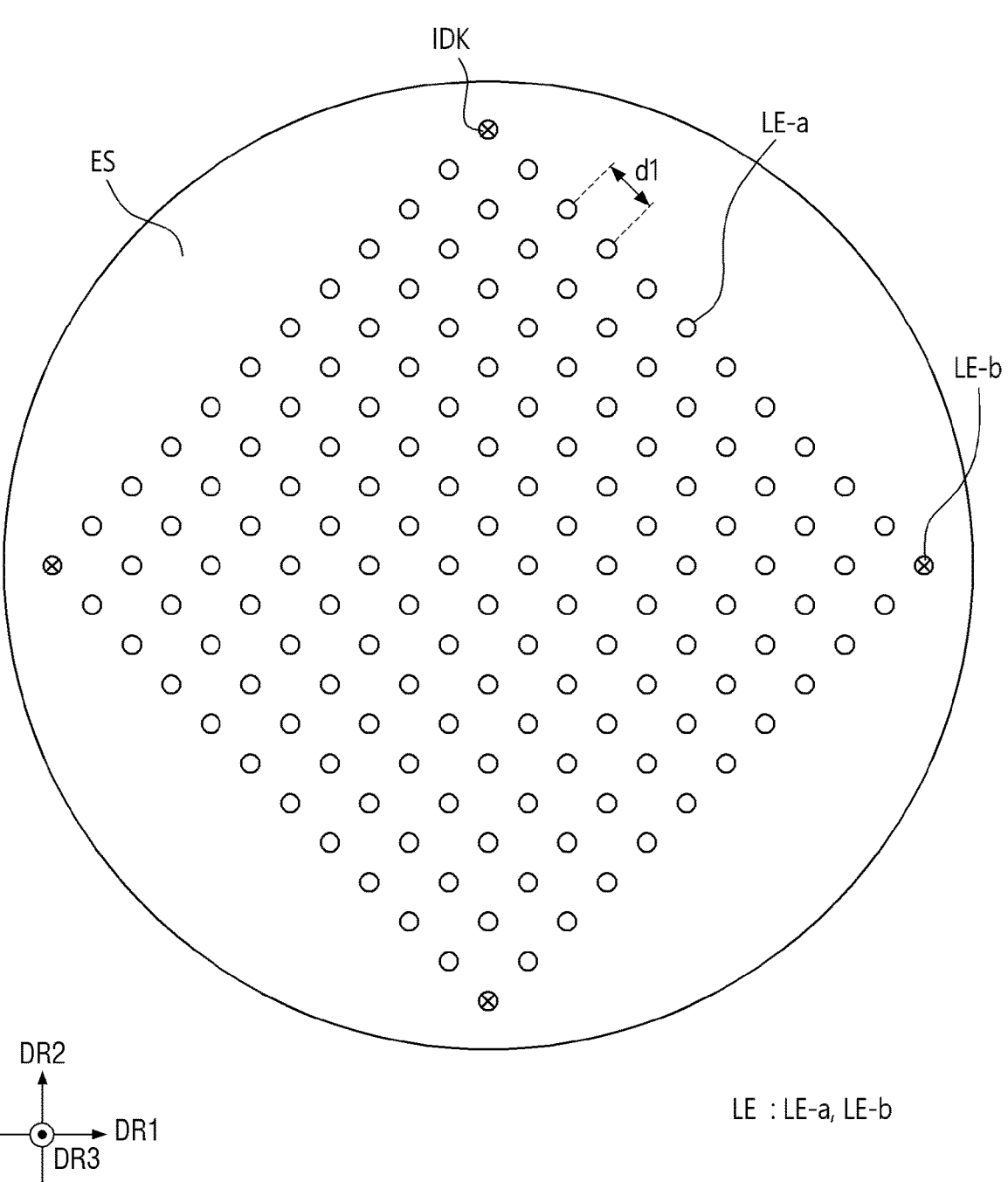
FIG. 6 is a plan view illustrating a transfer film on which light-emitting elements are disposed according to an embodiment of the present disclosure.
Figure 7:
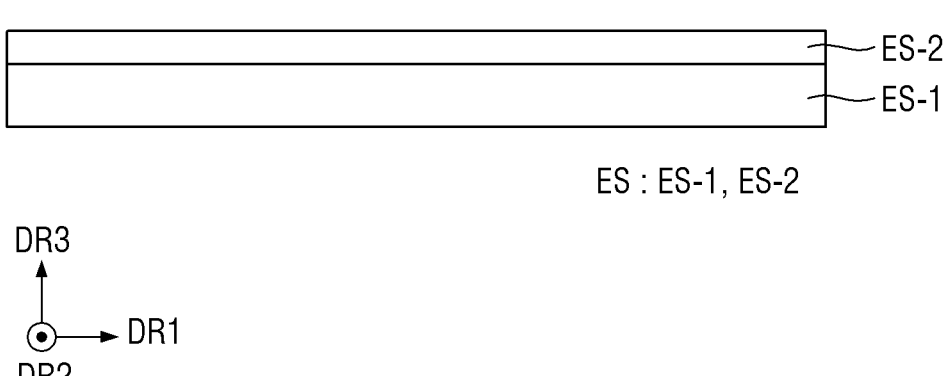
FIG. 7 is a side view of the transfer film according to an embodiment of the present disclosure.

FIG. 6 is a plan view illustrating a transfer film on which light-emitting elements are disposed according to an embodiment of the present disclosure. FIG. 7 is a side view of the transfer film according to an embodiment of the present disclosure.

Referring to FIGS. 6 and 7, the transfer film ES is used as a substrate for transferring the light-emitting elements LE grown on a silicon wafer onto the support substrate 110 (see, e.g., FIG. 4) of the display substrate 100 and, accordingly, may be referred to as a transfer substrate.

The transfer film ES may be made of a transparent, stretchable, and elastic polymer material. Examples of the stretchable, elastic polymer material may include, for example, polyolefin, polyvinyl chloride (PVC), elastomeric silicone, elastomeric polyurethane, elastomeric polyiso-prene, et. The transfer film ES may include a support layer ES-1 and an adhesive layer ES-2 disposed on the support layer ES-. The support layer ES-1 may be made of a material that is transparent to allow light to pass therethrough while having sufficient mechanical stability. For example, the support layer ES-1 may include a transparent polymer, such as polyester, polyacrylic, poly epoxy, polyethylene, polysty-rene, polyethylene terephthalate, et. The adhesive layer ES-2 may include an adhesive material for bonding the light-emitting elements L. For example, the adhesive material may include urethane acrylate, epoxy acrylate, polyester acrylate, et. The adhesive material may be a material whose adhesive strength changes as ultraviolet (UV) light or heat is applied thereto, and thus, the adhesive layer can be easily separated from the light-emitting elements LE.

The light-emitting elements LE disposed on the transfer film ES may be arranged at a first distance d. Herein, the first distance d1 may be measured from the center of a light-emitting element LE to the center of a neighboring (e.g., a directly adjacent) light-emitting element L.

The light-emitting elements LE may include first light-emitting elements LE-a and second light-emitting elements LE-. The second light-emitting elements LE-b are different from the first light-emitting elements LE-a because the former have alignment keys IDK.

The alignment keys IDK are elements for controlling the elongation rate in the elongation process. The alignment keys IDK may be formed by using a mask when the light-emitting elements LE are grow. The alignment keys IDK may be made of, for example, a metal having a high reflectance and conductivity, for example, silver (Ag), mag-nesium (Mg), aluminum (Al), platinum (Pt), lead (Pb), gold (Au), nickel (Ni), neodymium (Nd), iridium (Ir), chrome (Cr), lithium (Li), calcium (Ca), or a mixture thereof.

The alignment keys IDK have a cross shape in the drawings, but the shape is not limited thereto. The alignment keys IDK may be formed in various shapes, such as a circle shape, a donut shape, a square shape, etc., in addition to the cross shape.

Figure 8:
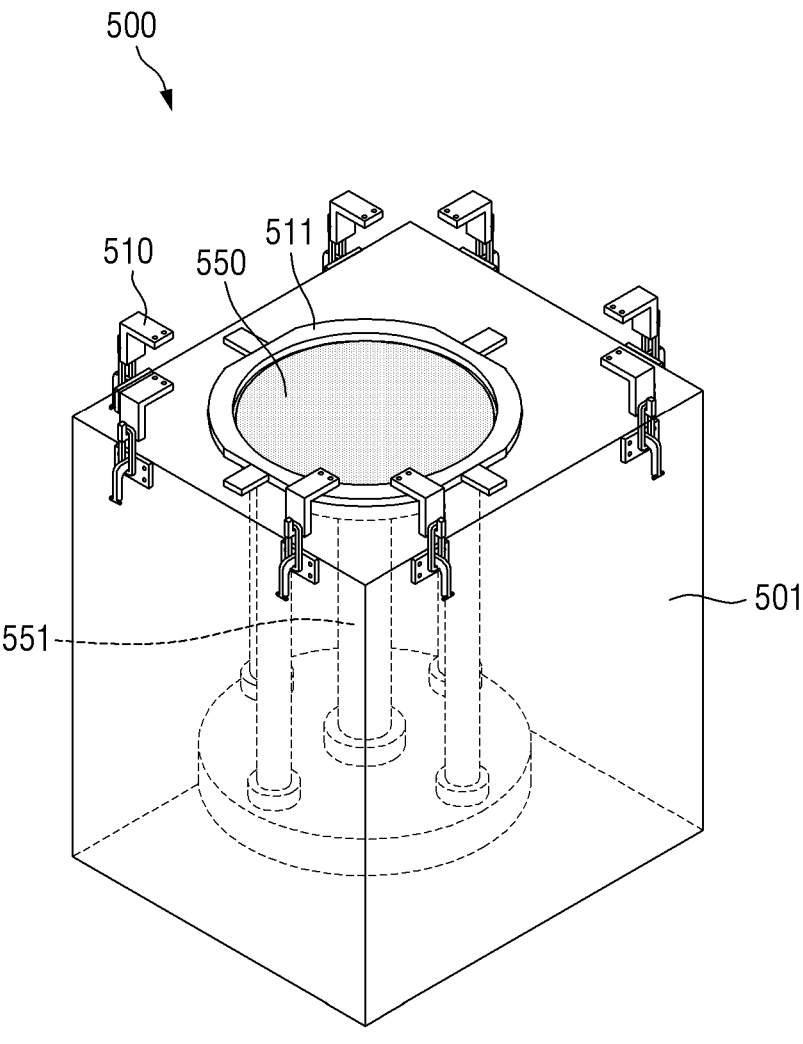
FIG. 8 is a perspective view schematically showing an apparatus for fabricating a display panel according to an embodiment of the present disclosure.
Figure 9:
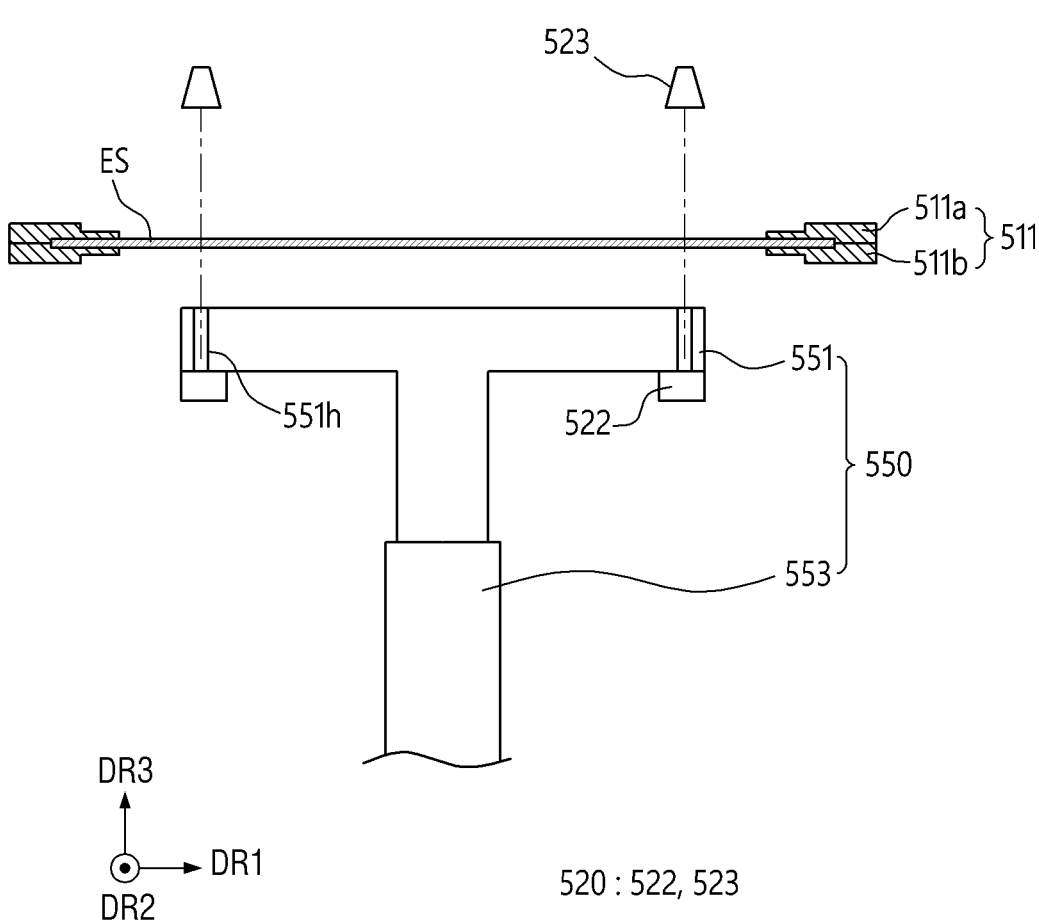
FIG. 9 is a cross-sectional view showing the fixing frame and the elongation processing member shown in FIG. 8.

FIG. 8 is a perspective view schematically showing an apparatus for fabricating a display panel according to an embodiment of the present disclosure. FIG. 9 is a cross-sectional view showing the fixing frame and the elongation processing member shown in FIG. 8 in more detail.

Referring to FIGS. 8 and 9, an apparatus 500 for fabri-cating a display panel includes a fixing frame 511, a film mount 510, an optical inspection member 520, and an elongation processing member 55. The apparatus 500 may further include a housing 50.

The fixing frame 511 fixes the outer circumference of a transfer film ES on which a plurality of light-emitting elements LE are disposed. The fixing frame 511 includes a pair of first and second assembly frames 511a and 511b having a circular opening. The first and second assembly frames 511a and 511b are implemented as a polygonal panel or frame, such as a circle and a quadrangle having a circular opening. The first and second assembly frames 511a and 511b may be formed as circular rings or ring-type frame.

The first and second assembly frames 511a and 511b are assembled such that they face each other. In addition, the first and second assembly frames 511a and 511b may be assembled such that the first assembly frame 511a is inserted into the second assembly frame 511. The first and second assembly frames 511a and 511b press and fix the outer circumference of the transfer film ES in a circular shape excluding the opening along the first and second assembly frames 511a and 511b surrounding the opening. The open-ings in the first and second assembly frames 511a and 511b may be formed in an ellipse or a polygonal shape, such as a quadrangle, depending on the elongation direction of the transfer film E. However, in one embodiment, the openings are circular and the outer circumference of the transfer film ES is pressed and fixed in a circular shape so that the transfer film ES can be evenly elongated.

The film mount 510 is disposed on top of or inside the housing 501 forming the exterior or the frame of the apparatus 50. The film mount 510 includes a mounting portion on which the fixing frame 511 is seated and at least one clip or ring-shaped fastening member that presses and fixes the outer surface of the fixing frame 51. The film mount 510 fixes the fixing frame 511 by fastening at least one outer circumference of the fixing frame 511 seated on the front mounting portion with at least one clip or a ring-shaped fastening member. In this manner, the position of the fixing frame 511 can be fixed while the transfer film ES is elongated by the elongation processing member 550.

Figure 10:
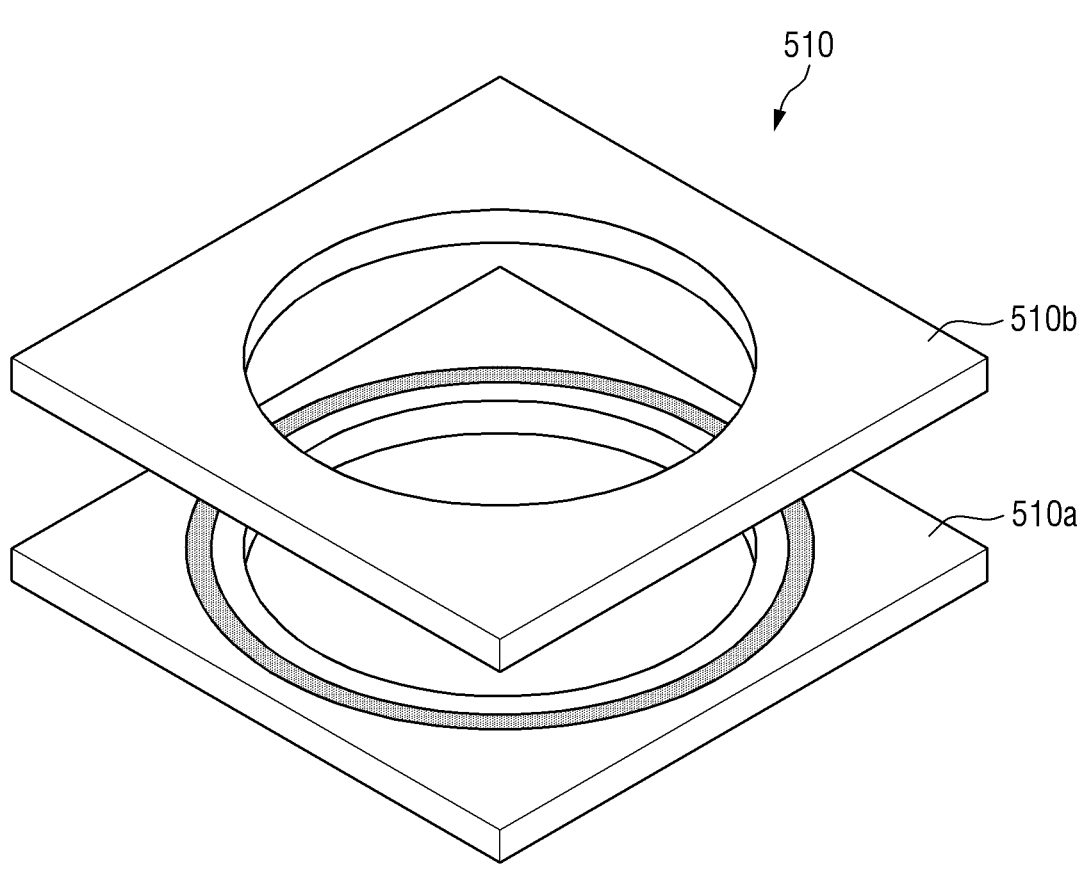
FIG. 10 is an exploded perspective view showing the film mount shown in FIG. 9 according to another embodiment.

FIG. 10 is an exploded perspective view showing the film mount shown in FIG. 9 according to another embodiment.

Referring to FIG. 10, the film mount 510 includes a first mounting frame 510a on which the fixing frame 511 is seated and a second mounting frame 510b that presses and fixes a part of the front surface and the outer circumference of the fixing frame 511 seated on the first mounting frame 510.

The first mounting frame 510a is formed in a circular or polygonal shape, such as rectangular panel or frame having a circular opening and is mounted on the top of or inside the housing 50. In addition, the second mounting frame 510b may also be formed in a circular or polygonal shape, such as rectangular panel or frame having a circular opening and may be assembled such that it faces the first mounting frame 510. For example, the first and second mounting frames 510a and 510b may be assembled such that they face each other so that they may press the outer circumference and parts of the front and rear surfaces of the fixing frame 511 except the circular opening to fix the fixing frame 51.

Referring back to FIG. 9, the optical inspection member 520 includes at least one pair of a light source 523 and a light-receiving sensor 52.

The light source 523 and the light-receiving sensor 522 are disposed on the same axis in (e.g., are aligned in) the third direction. The light-receiving sensor 522 may be disposed on the path of light irradiated by the light source 523 to detect the amount of the received light.

Although the light source 523 is disposed on the upper side while the light-receiving sensor 522 is disposed on the lower side in the illustrated embodiment, the present disclosure is not limited thereto. The light source 523 may be disposed on the lower side while the light-receiving sensor 522 may be disposed on the upper side.

The light source 523 and the light-receiving sensor 522 may be disposed with the plate-shaped frame 551 of the elongation processing member 550 interposed therebetween. The light-receiving sensor 522 may be disposed on the rear side of the plate-shaped frame 551, and the light source 523 may be spaced apart from the front surface of the plate-shaped frame 55.

The light-receiving sensor 522 may receive light irradiated from (e.g., emitted by) the light source 523 via a through hole 551h penetrating (e.g., extending through) the plate-shaped frame 551.

The light source 523, the light-receiving sensor 522, and the through hole 551h are located on (e.g., are aligned along) the same axis in the third direction. The light-receiving sensor 522 and the through hole 551h are formed along the path of light irradiated from the light source 523.

The light-receiving sensor 522 may receive the light that is irradiated from the light source 523 and that passes the through hole 551.

Referring to FIGS. 8 and 9, the elongation processing member 550 presses the transfer film ES fixed by the film mount 510 and the fixing frame 611 in a direction to elongate the overall width of the transfer film ES toward the outer circumference. For example, the elongation processing member 550 may press the rear surface of the transfer film ES having the light-emitting elements LE arranged on its front surface toward the front side to elongate the overall width of the transfer film ES toward the outer circumference.

The elongation processing member 550 includes the plate-shaped frame 551 and a transfer mechanism 553.

The plate-shaped frame 551 may be implemented as a disk-shaped or polygonal type pane. As described above, the plate-shaped frame 551 may have one or more through holes 551h.

The transfer mechanism 553 supports the rear surface of the plate-shaped frame 551 and moves the plate-shaped frame 551 toward the front or rear side of the plate-shaped frame 551, thereby pressing the rear surface of the transfer film ES toward the front side. The transfer mechanism 553 may be implemented as a hydraulic pump, such as a piston pump. The transfer mechanism 553 may control the degree of elongation of the transfer film ES based on an amount of the light detected by the optical inspection member 52. When the amount of the light detected by the optical inspection member 520 rapidly changes, the elongation processing member 550 may determine (or may confirm) that the position of the alignment keys IDK are located on the optical pat. When this happens, the elongation processing member 550 stops the movement of the transfer mechanism 55. In this manner, the elongation of the transfer film ES disposed on the plate-shaped frame 551 may be stopped. Control over the degree of elongation will be described later with reference to FIGS. 27 to 30.

Figure 11:
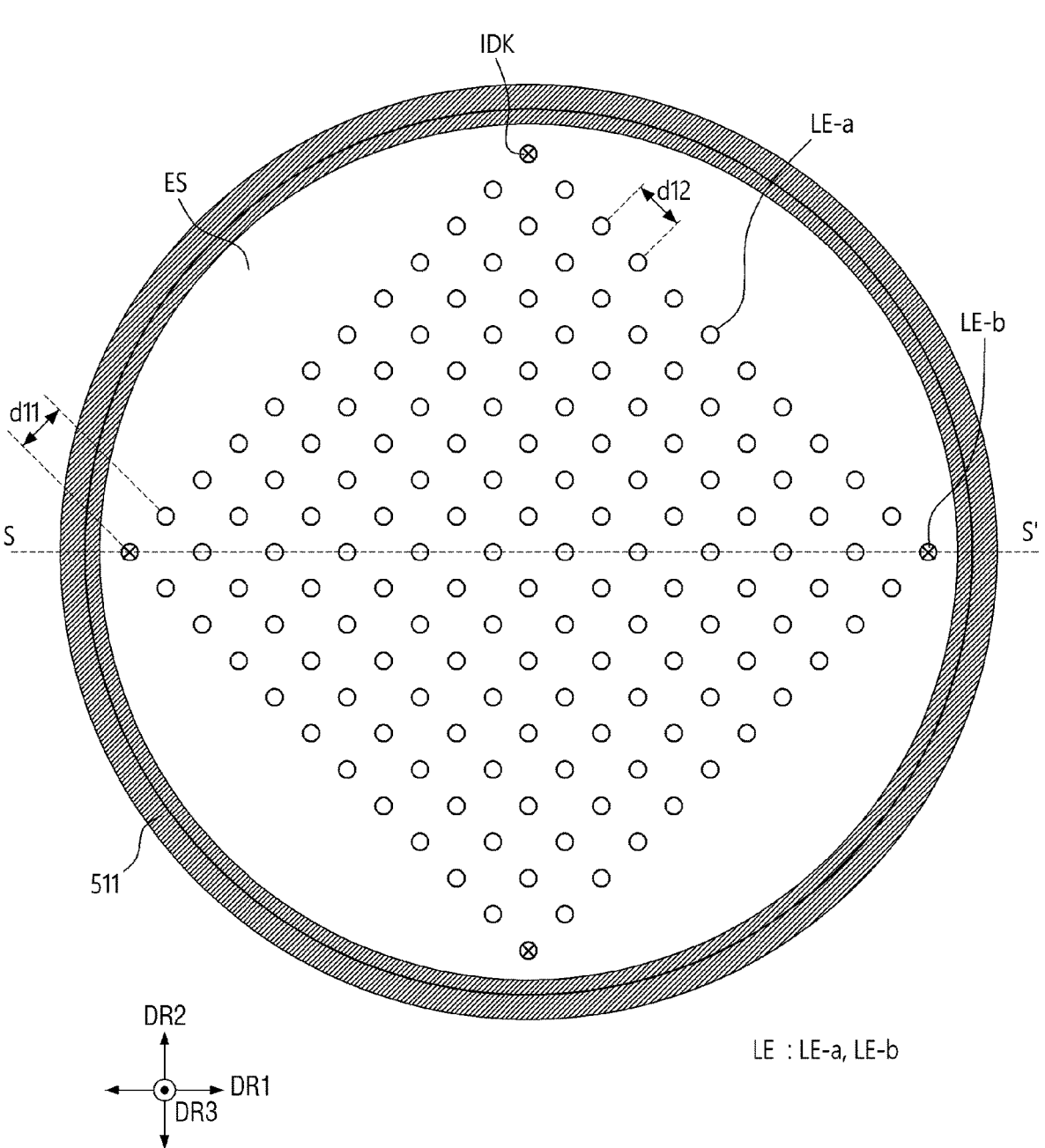
FIG. 11 is a plan view illustrating light-emitting elements disposed on a transfer film according to an embodiment of the present disclosure.
Figure 12:
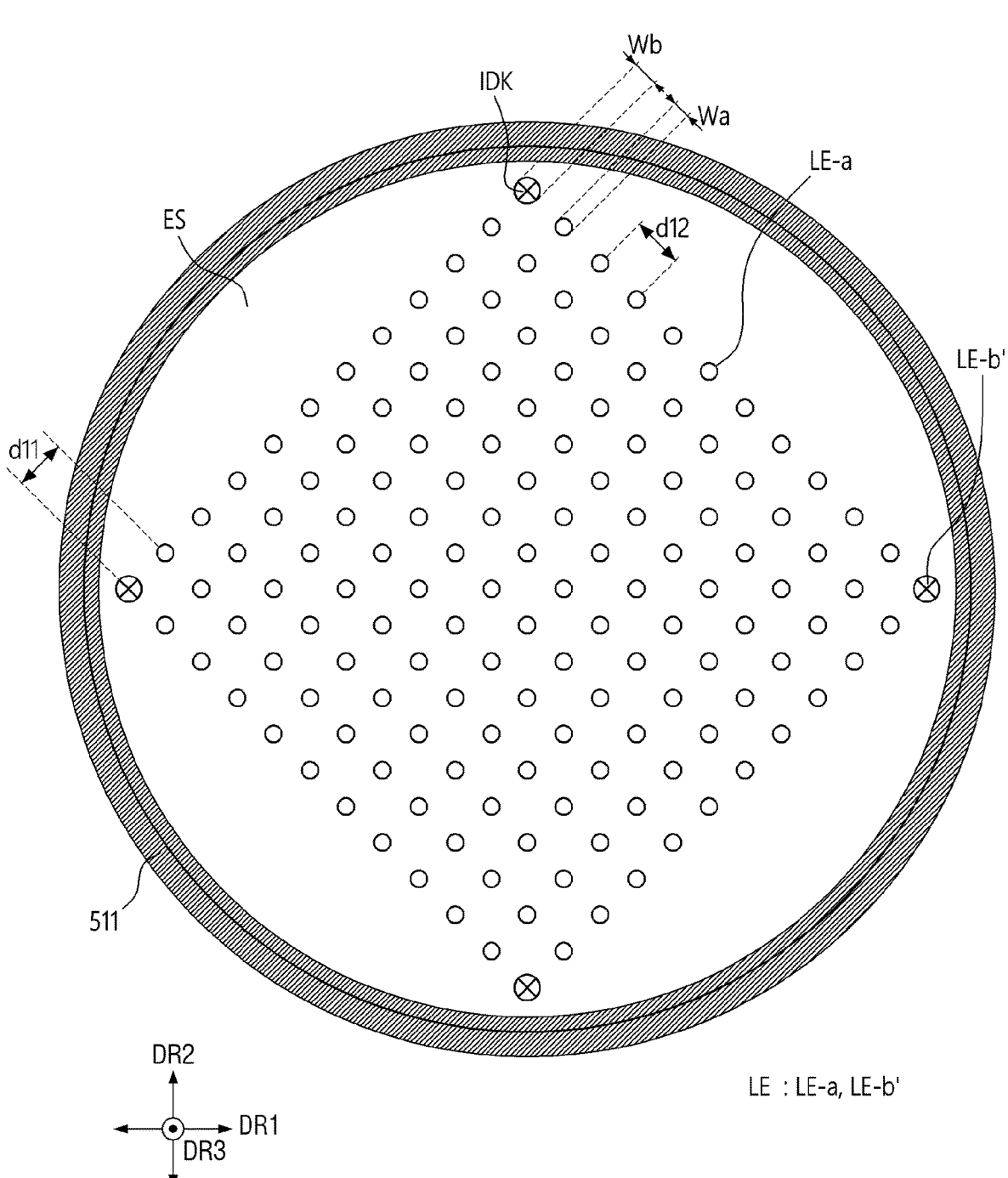
FIG. 12 is a plan view illustrating light-emitting elements disposed on a transfer film according to another embodiment of the present disclosure.
Figure 13:
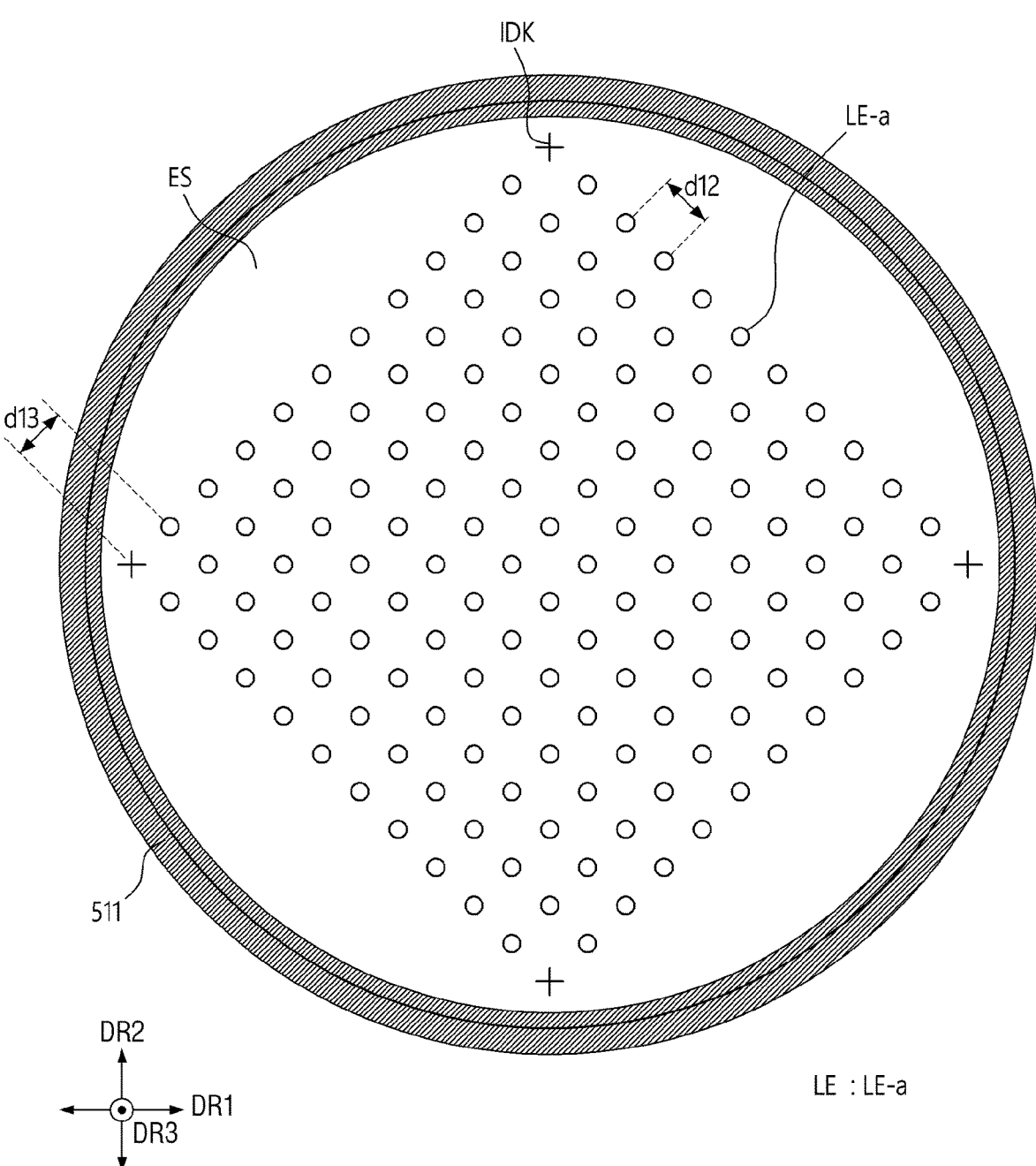
FIG. 13 is a plan view illustrating light-emitting elements disposed on a transfer film according to another embodiment of the present disclosure.

FIG. 11 is a plan view illustrating light-emitting elements disposed on a transfer film according to an embodiment of the present disclosure. FIG. 12 is a plan view illustrating light-emitting elements disposed on a transfer film according to another embodiment of the present disclosure. FIG. 13 is a view illustrating light-emitting elements disposed on a transfer film according to another embodiment of the present disclosure.

Referring to FIG. 11, the light-emitting elements LE are spaced apart from one another by a first distance d1 and disposed on the transfer fil. The distance (e.g., the first distance d1) may be measured from the center of a light-emitting element LE and the center of a neighboring (e.g., a directly adjacent) light-emitting element L.

First light-emitting elements LE-a and second light-emitting elements LE-b are spaced apart from each other. A distance d11 between the first light-emitting elements LE-a and the second light-emitting elements LE-b is equal to a distance d12 between the first light-emitting elements LE-.

The second light-emitting elements LE-b are different from the first light-emitting elements LE-a because the former have the alignment keys IDK. The alignment keys IDK of the second light-emitting elements LE-b are marks for adjusting the degree of elongation of the transfer film E. For example, the optical inspection member 520 (see, e.g., FIG. 9) may recognize the alignment keys IDK to control the degree of elongation.

The light-emitting elements adjacent to the second light-emitting elements LE-b may be the first light-emitting elements LE-. The number of first light-emitting elements LE-a may be greater than the number of second light-emitting elements LE-.

The second light-emitting elements LE-b may be disposed at the outermost positions on the array of the light-emitting element.

As shown in FIG. 12, the area of the second light-emitting elements LE-b' may be greater than the area of the first light-emitting elements LE-a to more easily identify the alignment keys IDK by the optical inspection member 520. Herein, the area may refer to the widths on a plane including the first and second direction. The width Wb of the second light-emitting elements LE-b' may be greater than the width Wa of the first light-emitting elements LE-.

The embodiment shown in FIG. 13 differs from the embodiment shown in FIG. 11 in that alignment keys IDK are disposed without the corresponding second light-emitting elements LE-.

When the alignment keys IDK are disposed without (e.g., independent of) the second light-emitting elements LE-b, the alignment keys IDK may be elongated together with the transfer film E. As the alignment keys IDK are elongated, the reflectance may decrease. Accordingly, for the optical inspection member 520 to recognize a change in reflectance even when the alignment keys IDK are elongated, the height of the alignment keys IDK in the third direction may be about 20% or more than the height of the first light-emitting elements LE-a.

In addition, in the embodiment shown in FIG. 13, the optical inspection member 520 may check (or determine) the elongation rate by locating the position of the alignment key IDK by using a camera. The camera may be disposed above the plate-shaped frame 551 of the elongation processing member 55.

According to another embodiment, the optical inspection member 520 may use an optical camera instead of a pair of a light source and a light-receiving senso. When an optical camera is used, the position of the optical camera may be disposed at the position of the light source 523 in FIG. 9, but the present disclosure is not limited thereto. The optical camera may be disposed at any position as long as it can capture (e.g., view) the alignment keys IDK within the viewing angle of the optical camera.

Figure 14:
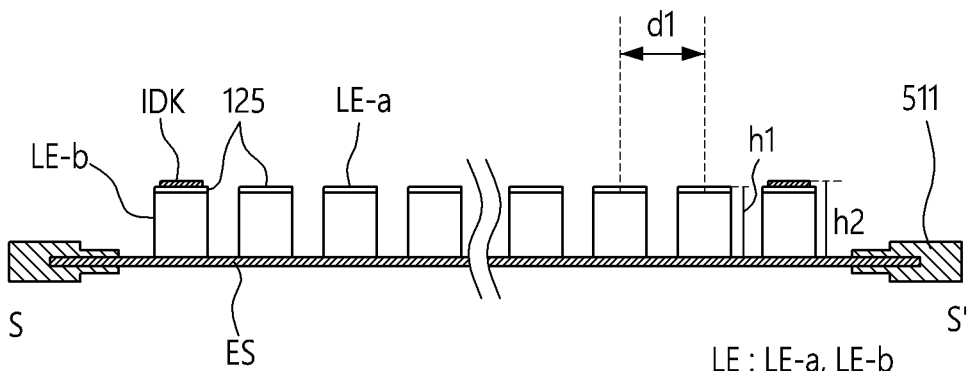
FIG. 14 is a cross-sectional view taken along the line S-S' of FIG. 1.
Figure 14:
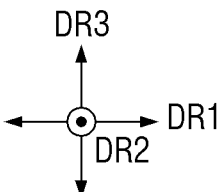

FIG. 14 is a cross-sectional view taken along the line S-S' of FIG. 1.

In each of the first light-emitting elements LE-a, the third semiconductor layer SEM3, the second semiconductor layer SEM2, the superlattice layer SLT, the active layer MQW, the electron blocking layer EBL, the first semiconductor layer SEM1, and the connection electrode 125 may be sequentially stacked on one another in the thickness direction of the transfer film ES, that is, in the third direction DR3.

In each of the second light-emitting elements LE-b, the third semiconductor layer SEM3, the second semiconductor layer SEM2, the superlattice layer SLT, the active layer MQW, the electron blocking layer EBL, the first semiconductor layer SEM1, the connection electrode 125, and the alignment key IDK may be sequentially stacked on one another in the thickness direction of the transfer film ES, that is, in the third direction DR3.

As shown in FIG. 14, the alignment keys IDK of the second light-emitting elements LE-b are disposed on the connection electrode 12. Accordingly, the height h2 of the second light-emitting elements LE-b may be greater than the height h1 of the first light-emitting elements LE-.

The transfer film ES and the connection electrode 125 may be made of a material that has a transmittance (e.g., a light transmittance) at least greater than that of the alignment keys ID. When the transfer film ES and the connection electrode 125 are made of a material having a higher transmittance than the alignment keys IDK, the alignment keys IDK can be more easily identified. If the transfer film ES and the connection electrode 125 are made of a material having a transmittance substantially equal to the transmittance of the alignment keys IDK, the alignment keys IDK may not be easily identified. Thus, the alignment keys IDK may be formed to be opaque so that the alignment keys IDK can be clearly distinguished from the other elements of the transfer film ES and the alignment keys IDK can be easily identified.

Figure 15:
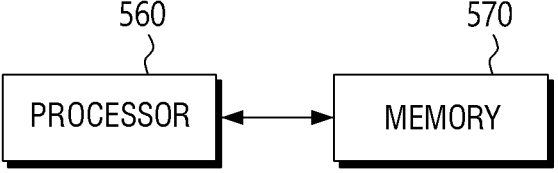
FIG. 15 is a block diagram illustrating a processor and a memory of an apparatus for fabricating a display panel according to an embodiment.

FIG. 15 is a block diagram describing a processor and a memory of an apparatus for fabricating a display panel according to an embodiment.

Referring to FIG. 15, the apparatus 500 for fabricating a display panel according to an embodiment may further include a processor 560 and a memory 570.

The processor 560 may be incorporated into the apparatus 500 and may control overall operations of the apparatus 50. In addition, the processor 560 may control overall operations of the apparatus 50.

The processor 560 can execute a method of fabricating a display panel, to be described later, by the apparatus 50. The processor 560 may be electrically connected to the optical inspection member 520 and the elongation processing member 550 to control these elements. For example, the processor 560 may control the degree of elongation or the elongation rate of the elongation processing member 550 based on the inspection results of the optical inspection member 520.

It should be understood, however, that a number of independent processors may control respective elements instead of the single processor 560 controlling all the elements.

The processor 560 may include one or more of a central processing unit (CPU), a controller, an application processor (AP), a communication processor (CP), and an ARM processor.

In addition, the processor 560 may be electrically connected to the memory 570, and the functions of the processor 560 according to an embodiment may be stored in the memory 570, which will be described later in more detail.

The memory 570 may be incorporated into the apparatus 50. In addition, the memory 570 may be implemented as at least one of a flash memory, a ROM, a RAM, a hard disk, a multimedia card micro memory, and a card type memory (e.g., a SD or XD memory, etc.).

In addition, the memory 570 may be electrically connected to the processor 560 and may transmit/receive signals and information to/from the processor 56. Accordingly, the memory 570 may store input or inspected information for controlling the elongation processing member 550 and may transmit characteristic information stored in the processor 56.

Information for controlling the elongation processing member 550 may be a reference amount of light for stopping the transfer of the transfer mechanism 553 of the elongation processing member 55.

The processor 560 may start the transfer by the transfer mechanism 553 of the elongation processing member 550 and may monitor the amount of light detected by the optical inspection member 52. The processor 560 may interrupt the transfer by the transfer mechanism 553 when the amount of light suddenly change. In this manner, the elongation of the transfer film ES disposed on the elongation processing member 550 can be controlled.

Figure 16:
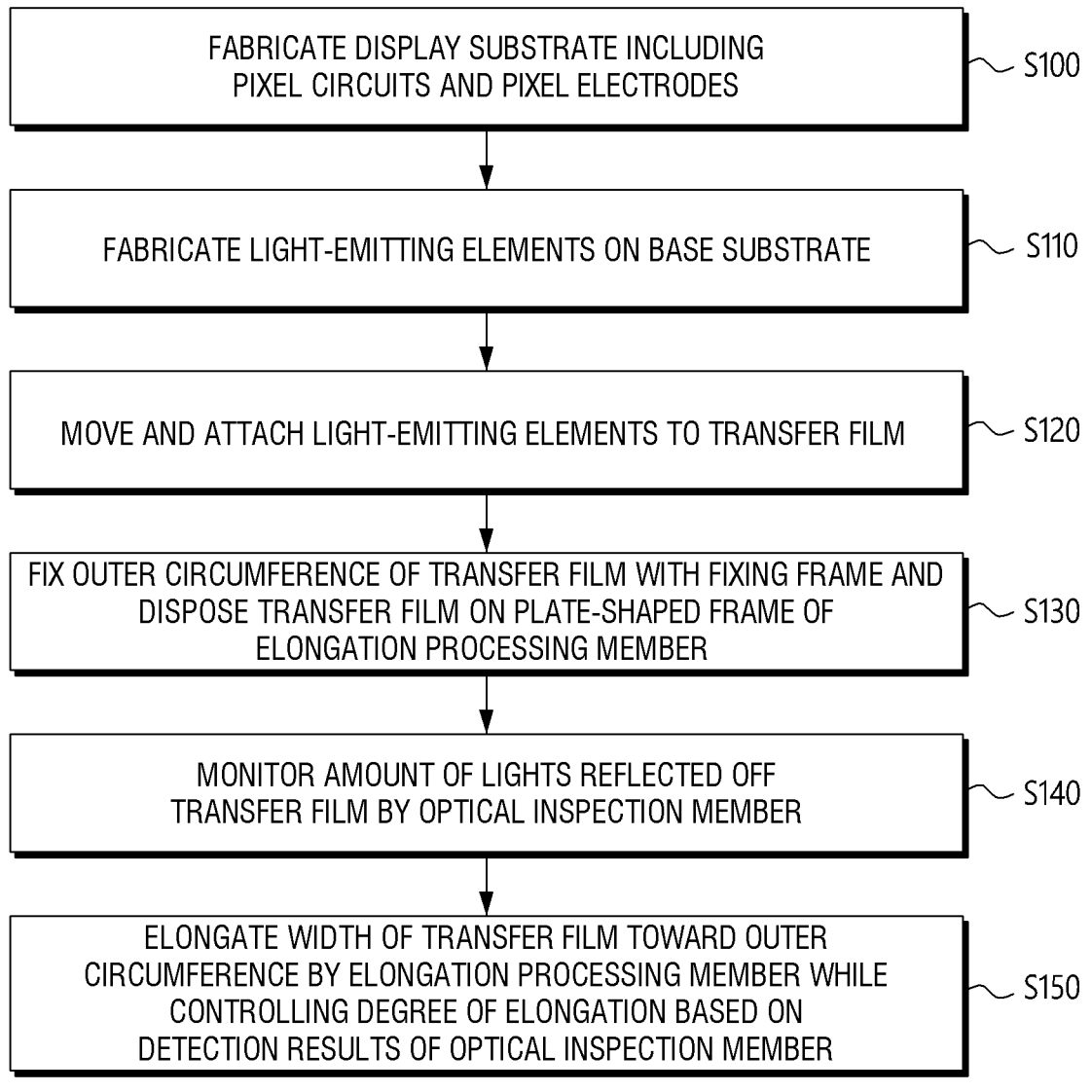

FIG. 16 is a flowchart describing a method for fabricating a display panel using the apparatus shown in FIG. 8 and. FIGS. 17 to 23 are cross-sectional views illustrating steps of a method of fabricating light-emitting elements according to an embodiment of the present disclosure.

Initially, a display substrate including pixel circuits and pixel electrodes is prepared (step S100 of FIG. 16).

Figure 17:
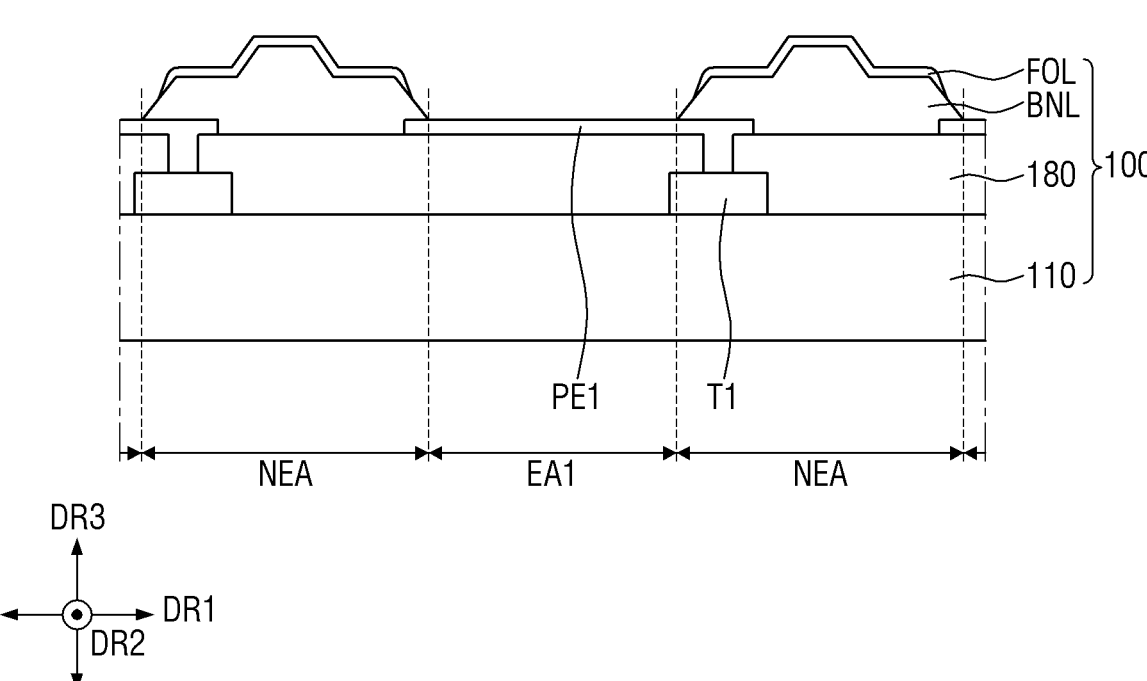
FIGS. 17 to 23 are cross-sectional views illustrating steps of the method of fabricating light-emitting elements according to an embodiment of the present disclosure.

Referring to FIG. 17, to fabricate the display substrate 100, thin-film transistors T1 are formed on a first substrate (e.g., the support substrate) 110 and an insulating layer 180 is formed over the thin-film transistors T. The first substrate 110 may be a transparent insulating substrate or a glass or quartz substrate. Contact holes (e.g., contact openings) exposing the first thin-film transistors T1 may be formed in the insulating layer 180.

Subsequently, a transparent conductive material is deposited on the insulating layer 180 and is patterned to form a plurality of pixel electrodes, for example, a first pixel electrode PE. The first pixel electrode PE1 may be connected to the thin-film transistors T1 through the contact holes formed in the insulating layer 18. Then, a first organic material is applied on the first substrate 110 and is patterned to form a bank BNL. The bank BNL exposes the first pixel electrode PE1 to define a first emission area EA.

Subsequently, a second organic material is applied on the first substrate 110 and is patterned to form a first organic layer FO. The first organic layer FOL may be formed on the bank BNL and may be spaced apart from the first emission area EA. As described above, the first organic layer FOL may be polyimide including a cyano group.

Figure 18:
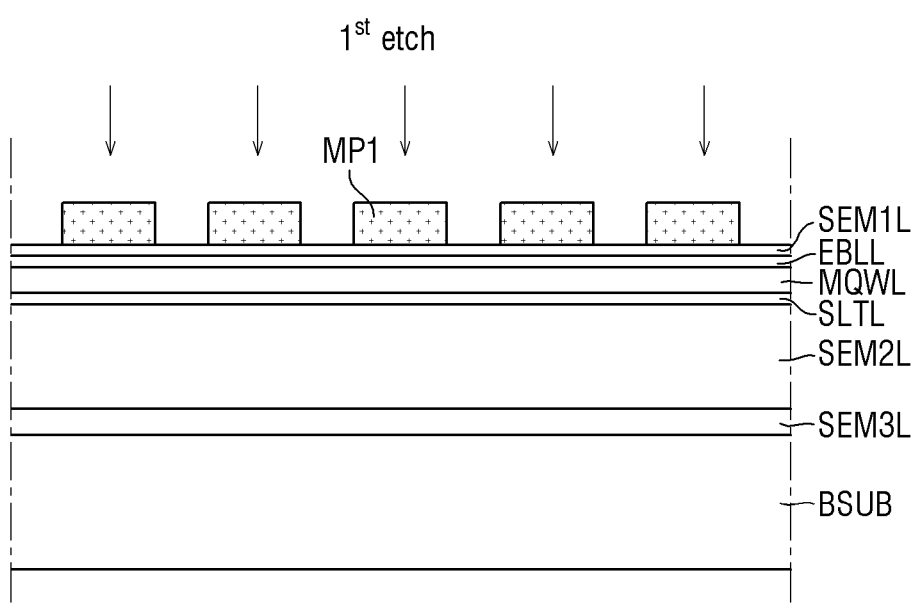
Figure 18:
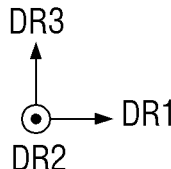

Subsequently, referring to FIGS. 18 and 19, light-emitting elements LE may be separately formed on a base substrate BSUB (step S110 of FIG. 16. A sapphire substrate (e.g., $Al_2O_3$) or a silicon wafer including silicon is used (or is prepared) as the base substrate BSUB. A plurality of semiconductor material layers SEM3L, SEM2L, SLTL, MQML, EBLL, and SEM1L is formed on the base substrate BSU. The plurality of semiconductor material layers grown by the epitaxial method may be formed by growing a seed crystal. The method of forming the semiconductor material layers may include an electron beam deposition method, physical vapor deposition (PVD), chemical vapor deposition (CVD), plasma laser deposition (PLD), dual-type thermal evaporation, sputtering, metal-organic chemical vapor deposition (MOCVD), et. In one embodiment, the method may be carried out by metal-organic chemical vapor deposition (MOCVD). It is, however, to be understood that the present disclosure is not limited thereto.

A precursor material for forming the plurality of semiconductor material layers is not particularly limited and any typical material well known in the art may be selected as long as it can form a target material. For example, the precursor material may be a metal precursor including an alkyl group, such as a methyl group or an ethyl group. For example, the precursor material may be, but is not limited to, a compound such as trimethyl gallium ($Ga(CH_3)_3$), trimethyl aluminum ($Al(CH_3)_3$), or triethyl phosphate (($C_2H_5$)$_3PO_4$).

A third semiconductor material layer SEM3L is formed on the base substrate BSUB. Although the third semiconductor material layer SEM3L is shown as being a single layer in the drawings, the present disclosure is not limited thereto. The third semiconductor material layer SEM3L may form a plurality of layer. The third semiconductor material layer SEM3L may be disposed to reduce a lattice constant difference between the second semiconductor material layer SEM2L and the base substrate BSU. For example, the third semiconductor material layer SEM3L may include an undoped semiconductor and may be a material not doped into an n-type or p-type (e.g., may be a material not doped with an n-type or p-type dopant). In an embodiment, the third semiconductor material layer SEM3L may be, but is not limited to, at least one of undoped InAlGaN, GaN, AlGaN, InGaN, AlN, and In.

The second semiconductor material layer SEM2L, the superlattice material layer SLTL, the active material layer MQWL, the electron blocking material layer EBLL and the first semiconductor material layer SEM1L are sequentially formed on the third semiconductor material layer SEM3L by using the above-described method. Subsequently, the plurality of semiconductor material layers SEM3L, SEM2L, SLTL, MQML, EBLL, and SEM1L are etched to form a plurality of light-emitting elements L.

A plurality of first mask patterns MP1 is formed on the first semiconductor material layer SEM1. The first mask pattern MP1 may be a hard mask including an inorganic material or a photoresist mask including an organic material. The first mask pattern MP1 prevents the plurality of semiconductor material layers SEM3L, SEM2L, SLTL, MQML, EBLL and SEM1L from being etched. Subsequently, parts of the plurality of semiconductor material layers are etched (1st etch) by using the plurality of first mask patterns MP1 as a mask to form a plurality of light-emitting elements LE.

Figure 19:
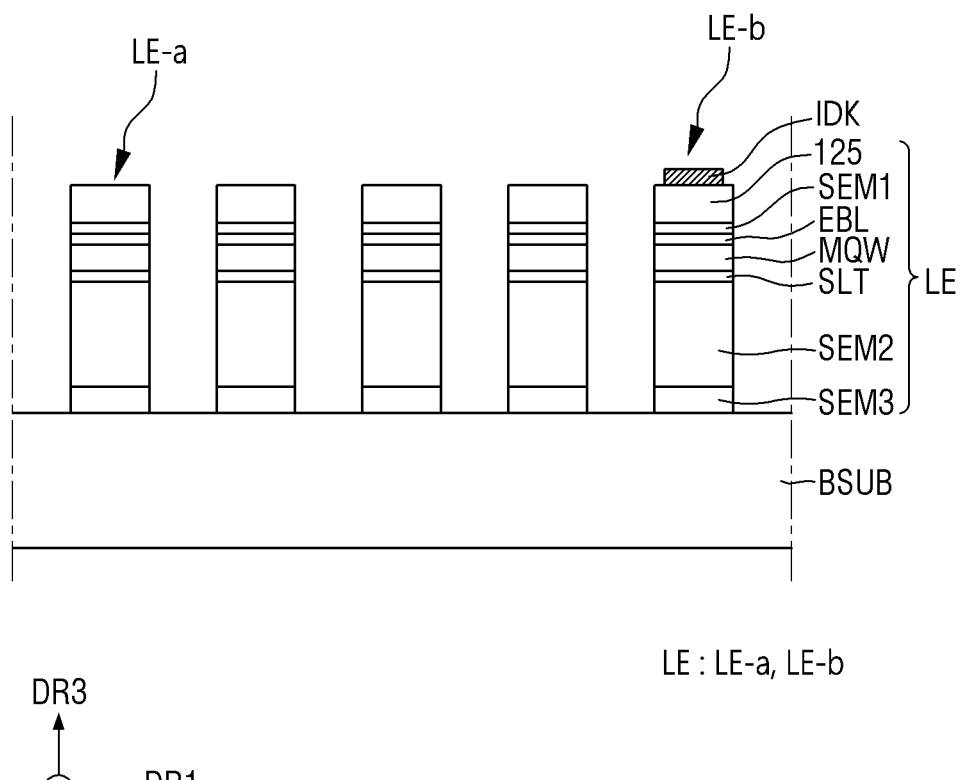

As shown in FIG. 19, a plurality of semiconductor material layers SEM3L, SEM2L, SLTL, MQML, EBLL, and SEM1L, which does not overlap with the first mask pattern MP1, are etched and removed from the base substrate BSU. The other parts thereof that overlap with the first mask pattern MP1 and, thus, are not etched may be formed as a plurality of light-emitting elements LE.

The semiconductor material layers may be etched by typical methods well known in the ar. For example, the process of etching the semiconductor material layers may include dry etching, wet etching, reactive ion etching (RIE), deep reactive ion etching (DRIE), inductively-coupled-plasma reactive ion etching (ICP-RIE), et. The dry etching allows for anisotropic etching, and thus, it may be suitable for vertical etching. When any of the above-described etching methods is used, the etching etchant may be $Cl_2$ or O. It is, however, to be understood that this is merely illustrative.

Parts of the plurality of semiconductor material layers SEM3L, SEM2L, SLTL, MQML, EBLL and SEM1L that are in line with (e.g., are covered by) the first mask pattern MP1 are not etched and formed as a plurality of light-emitting elements LE. Therefore, the plurality of light-emitting elements LE includes the third semiconductor layer SEM3, the second semiconductor layer SEM2, the superlattice layer SLT, the active layer MQW, the electron blocking layer EBL, and the first semiconductor layer SEM.

Subsequently, the connection electrodes 125 are formed on the plurality of light-emitting elements LE by stacking a connection electrode material layer on the base substrate BSUB and etching it. The connection electrodes 125 may be formed directly on the upper surface of the first semiconductor layer SEM1 of the light-emitting elements L. The connection electrodes 125 may include a transparent conductive material. For example, the connection electrodes 125 may be made of a transparent conductive oxide (TCO) such as indium tin oxide (ITO) and indium zinc oxide (IZO). In addition, a metal layer having a high reflectance, such as aluminum (Al), copper (Cu), and gold (Au) may be additionally formed on the connection electrodes 125 made of the transparent conductive oxide.

Subsequently, an alignment key metal layer is disposed on the base substrate BSUB and is patterned by using a mask so that alignment keys IDK are formed on the connection electrodes 125 of the plurality of light-emitting elements L. The alignment keys IDK may include a conductive material having high reflectivity. The alignment keys IDK may be made of a material having higher reflectivity than at least the connection electrodes 12. For example, the alignment keys IDK may be made of aluminum (Al), copper (Cu), or gold (Au.

Because the alignment keys IDK are opaque, they can be clearly distinguished from the connection electrodes 125, and the alignment keys IDK can be easily identified.

Figure 20:
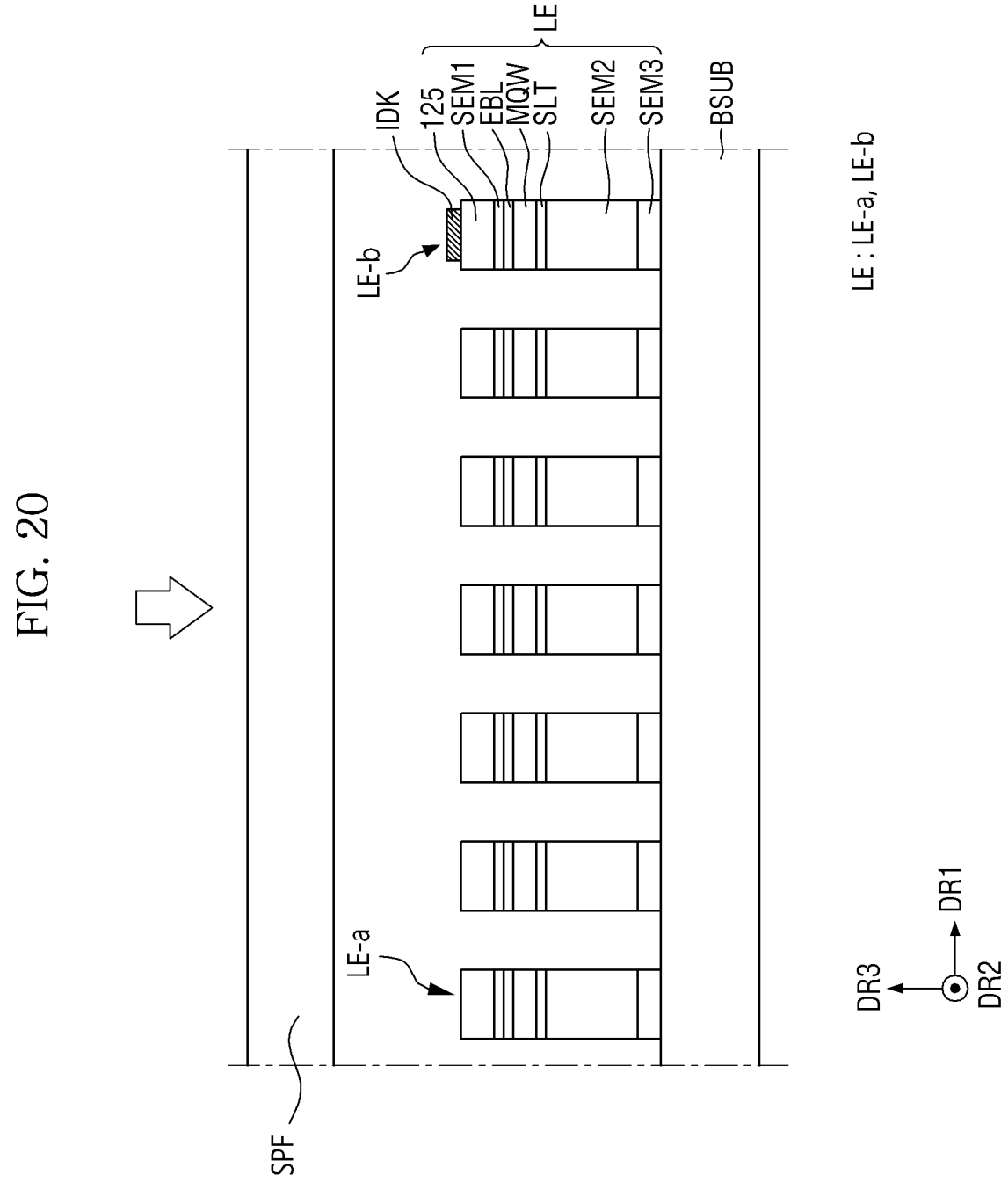

Referring to FIGS. 19 and 20, in order to vary the arrangement width of the light-emitting elements LE formed on the base substrate BSUB (e.g., the arrangement distance between the light-emitting elements LE), the upper surfaces of the light-emitting elements LE may be attached to the support film SPF and the light-emitting elements LE are moved, and then, the lower surfaces of the light-emitting elements LE may attached to the transfer film ES and the light-emitting elements LE may be moved (step S120 of FIG. 16.

To this end, the support film SPF is first attached to the plurality of light-emitting elements LE formed on the base substrate BSU. Accordingly, the connection electrodes 125 of the light-emitting elements LE may be attached to the support film SPF. Because a number of light-emitting elements LE are attached to the first support film SPF1, the first support film SPF1 can be attached reliably without unintended detachment therefrom.

The support film SPF may include a support layer and an adhesive layer disposed on the support layer. The support layer may be made of a material that is transparent to allow light to pass therethrough while having sufficient mechanical stability. For example, the support layer may include a transparent polymer, such as polyester, polyacrylic, poly epoxy, polyethylene, polystyrene, polyethylene terephthalate, et. The adhesive layer may include an adhesive material for bonding the light-emitting elements L. For example, the adhesive material may include urethane acrylate, epoxy acrylate, polyester acrylate, et. The adhesive material may be a material whose adhesive strength changes as ultraviolet (UV) light or heat is applied, and thus, the adhesive layer can be easily separated from the light-emitting elements LE.

Figure 21:
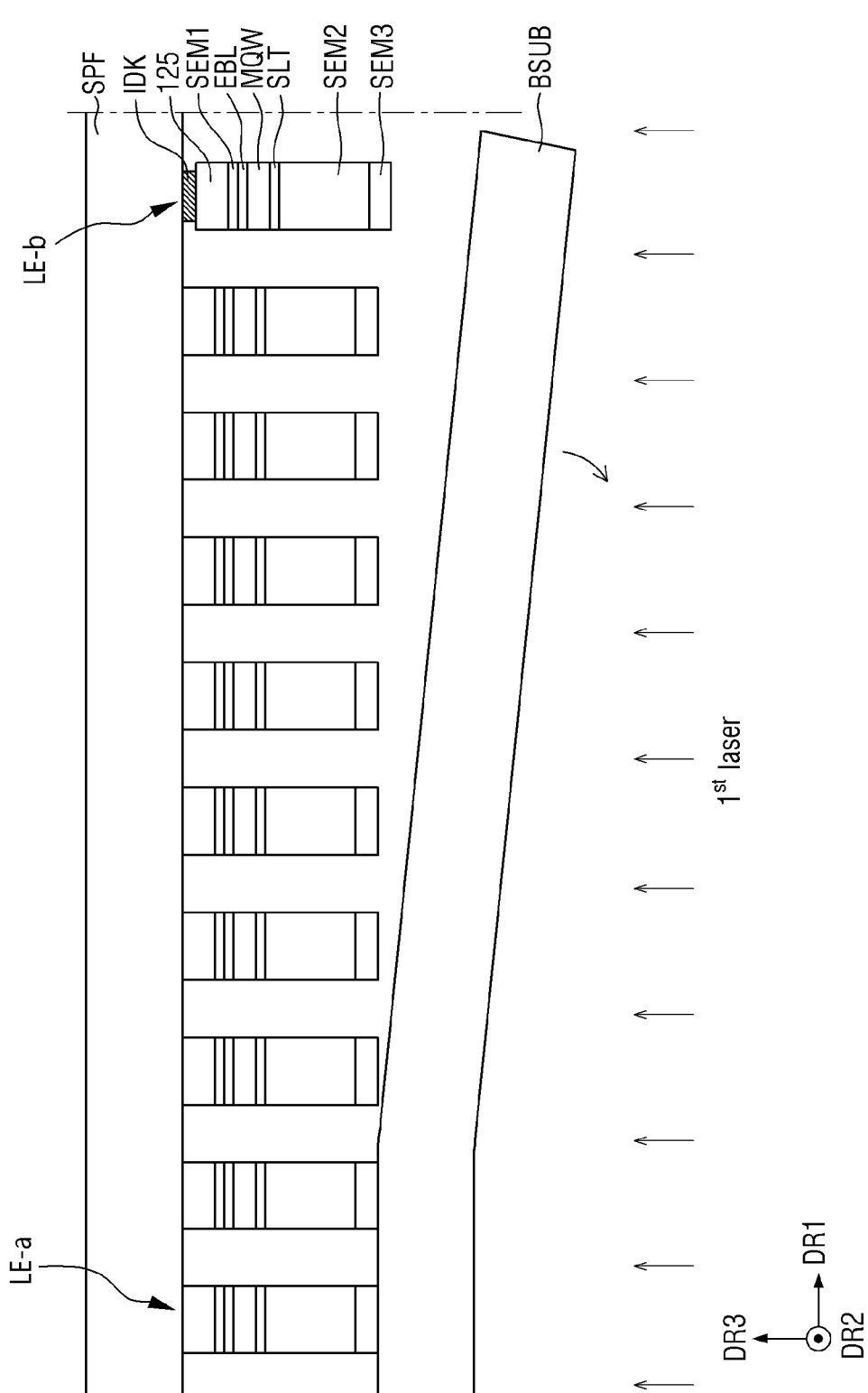

Subsequently, referring to FIG. 21, the base substrate BSUB is separated by irradiating it with a laser (1st laser. The base substrate BSUB is separated from the third semiconductor layers SEM3 of the plurality of light-emitting elements L.

Figure 22:
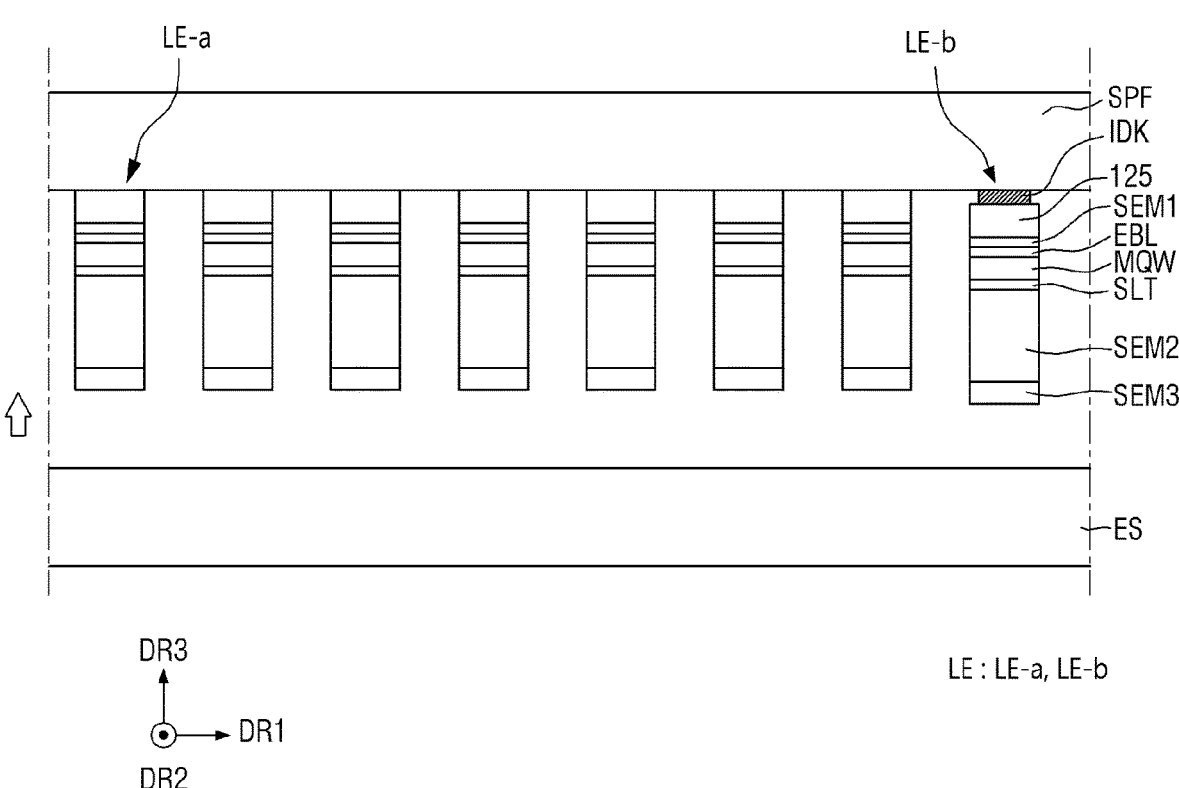
Figure 23:
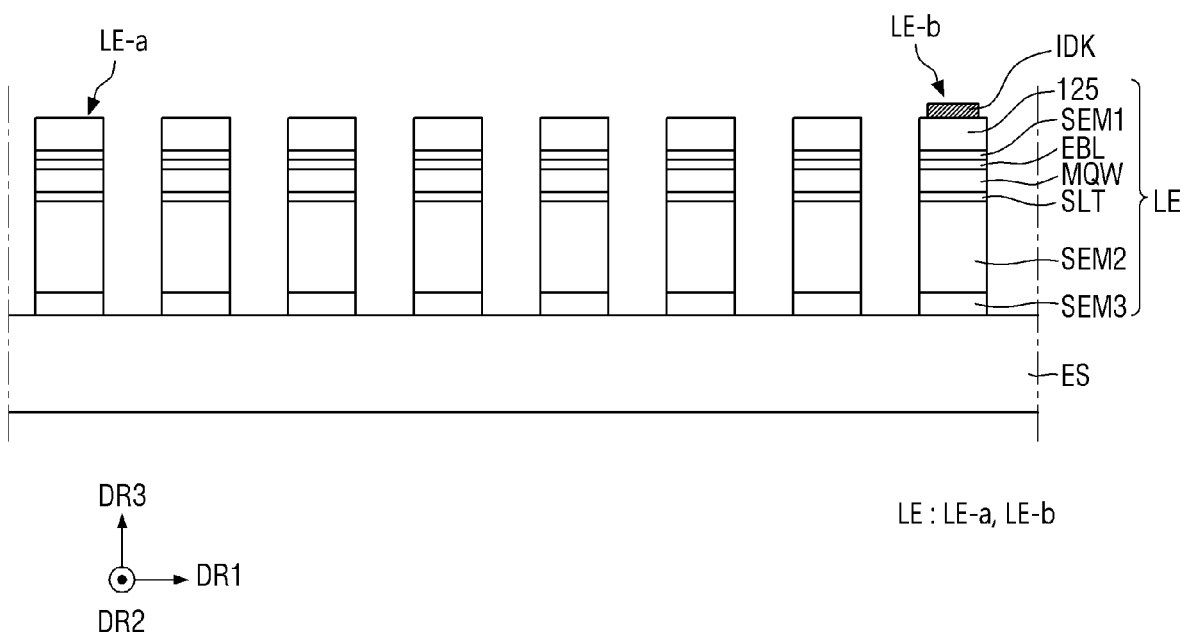

Referring to FIGS. 22 and 23, the transfer film ES is attached to the light-emitting elements LE after the base substrate BSUB is separated therefrom. The transfer film ES is attached to the third semiconductor layer SEM3 of each of the plurality of light-emitting elements LE. The transfer film ES may be aligned on the plurality of light-emitting elements LE and may be attached to the third semiconductor layers SEM3 of the plurality of light-emitting elements L.

The transfer film ES may include a stretchable material. Examples of the stretchable material may include, for example, polyolefin, polyvinyl chloride (PVC), elastomeric silicone, elastomeric polyurethane, elastomeric polyisoprene, et. Similar to the support film SPF described above, the transfer film ES may also include a support layer and an adhesive layer to adhere and support the light-emitting elements L.

Referring to FIG. 23, the support film SPF is separated from the light-emitting elements L. By applying ultraviolet light or heat to the support film SPF to reduce the adhesive strength of the adhesive layer of the support film SPF, the support film SPF may be physically or naturally detached therefrom.

Figure 24:
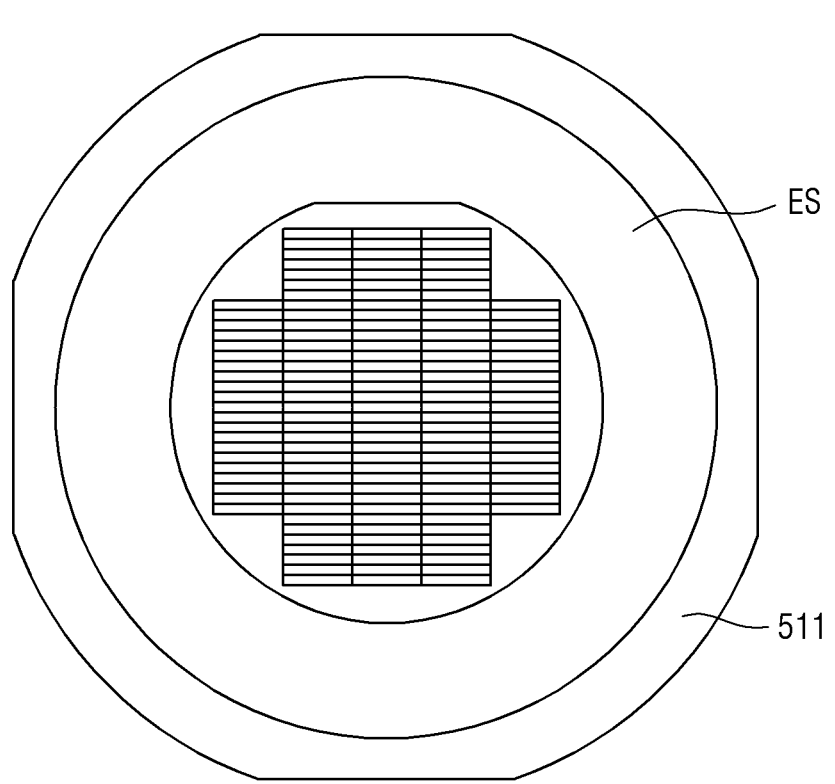
FIG. 24 is a perspective view schematically showing a transfer film on which light-emitting elements fabricated according to an embodiment are arranged.
Figure 25:
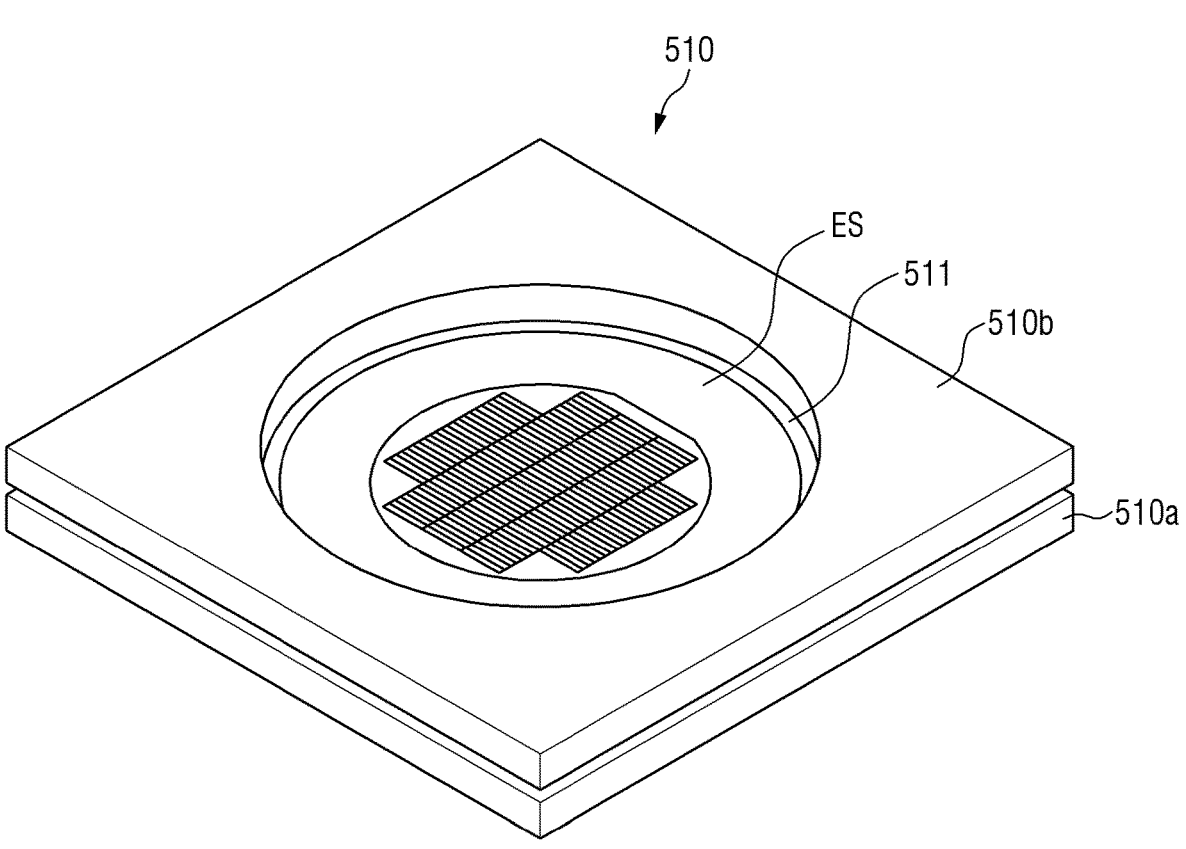
FIG. 25 is a perspective view schematically showing the transfer film shown in FIG. 24 mounted on a film mount.

FIG. 24 is a perspective view schematically showing a transfer film on which light-emitting elements fabricated according to an embodiment are arranged. FIG. 25 is a perspective view schematically showing the transfer film shown in FIG. 24 mounted on a film mount.

Referring to FIG. 24, a transfer film ES, on which light-emitting elements LE are spaced apart from one another at a first distance and arranged in a dot shape, is fixed by a fixing frame 511 and disposed on a plate-shaped frame 551 (see, e.g., FIG. 9) of the elongation processing member 550 (step S130 of FIG. 16. For example, the transfer film ES is disposed between first and second assembly frames 511*a* and 511*b* of the fixing frame 511, which are assembled to face each other. Accordingly, the first and second assembly frames 511*a* and 511*b* press the outer circumference and parts of the front and rear surfaces of the transfer film ES in a circular shape except the opening by the circular opening to thereby fix the outer circumference of the transfer film ES.

Referring to FIG. 25, the fixing frame 511 fixing the outer circumference of the transfer film ES is seated on the mounting portion of the first mounting frame 510*a* having the circular opening. Then, a second mounting frame 510*b* having a circular opening is assembled on the first mounting frame 510*a* such that it faces the first mounting frame 510*a* with the fixing frame 511 therebetween. For example, the first and second mounting frames 510*a* and 510*b* are assembled such that they face each other with the fixing frame 511 therebetween and overlap each other, and they press the outer circumference of the fixing frame 511 and parts of the front and rear surfaces excluding the circular opening to fix the fixing frame 51.

Figure 26:
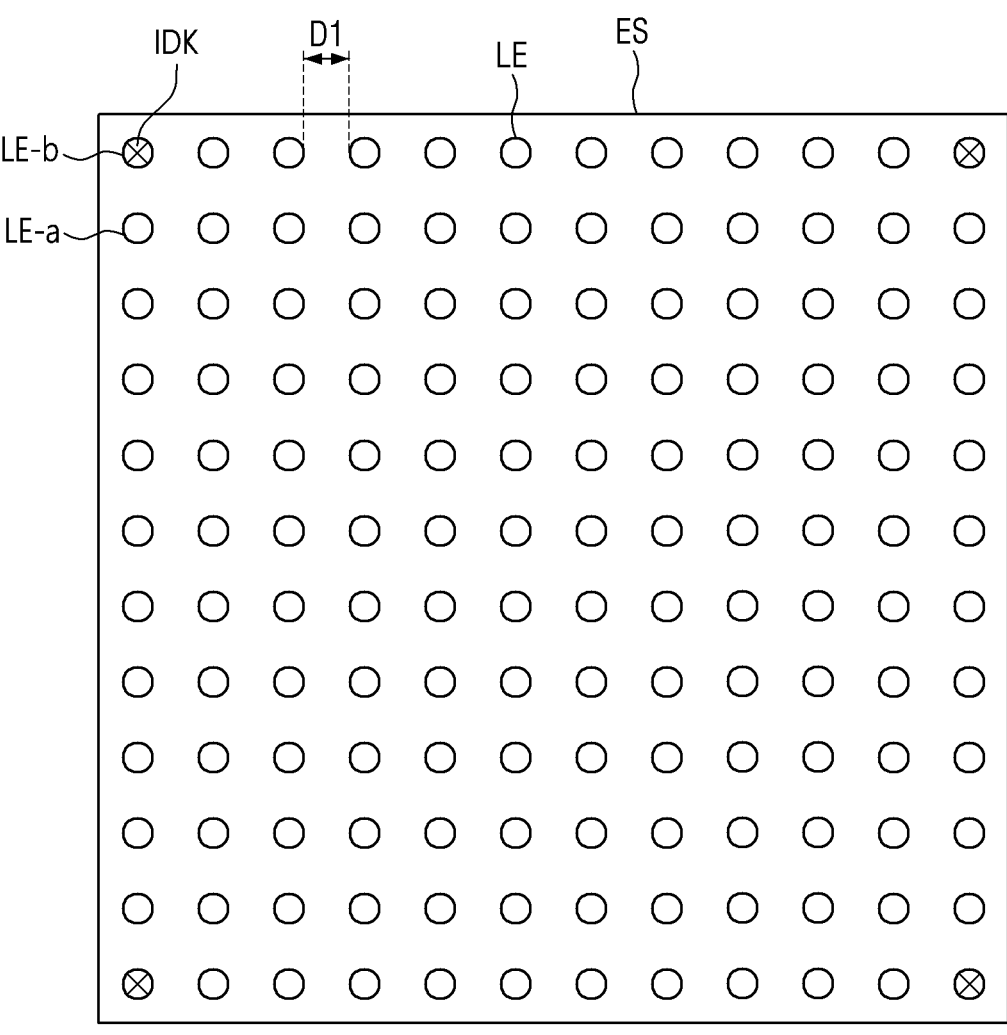
FIG. 26 is a front view schematically showing the arrangement of some of light-emitting elements arranged on the transfer film shown in FIG. 2.

FIG. 26 is a front view schematically showing the arrangement of some of light-emitting elements arranged on the transfer film shown in FIG. 2.

As shown in FIG. 26, light-emitting elements LE are spaced apart from one another by a first distance D1 and arranged in a dot shape on the transfer film ES fixed by the fixing frame 511 and the film mount 51.

FIGS. 27 to 30 are cross-sectional and front views illustrating steps of a method of elongating a transfer fil.

Figure 27:
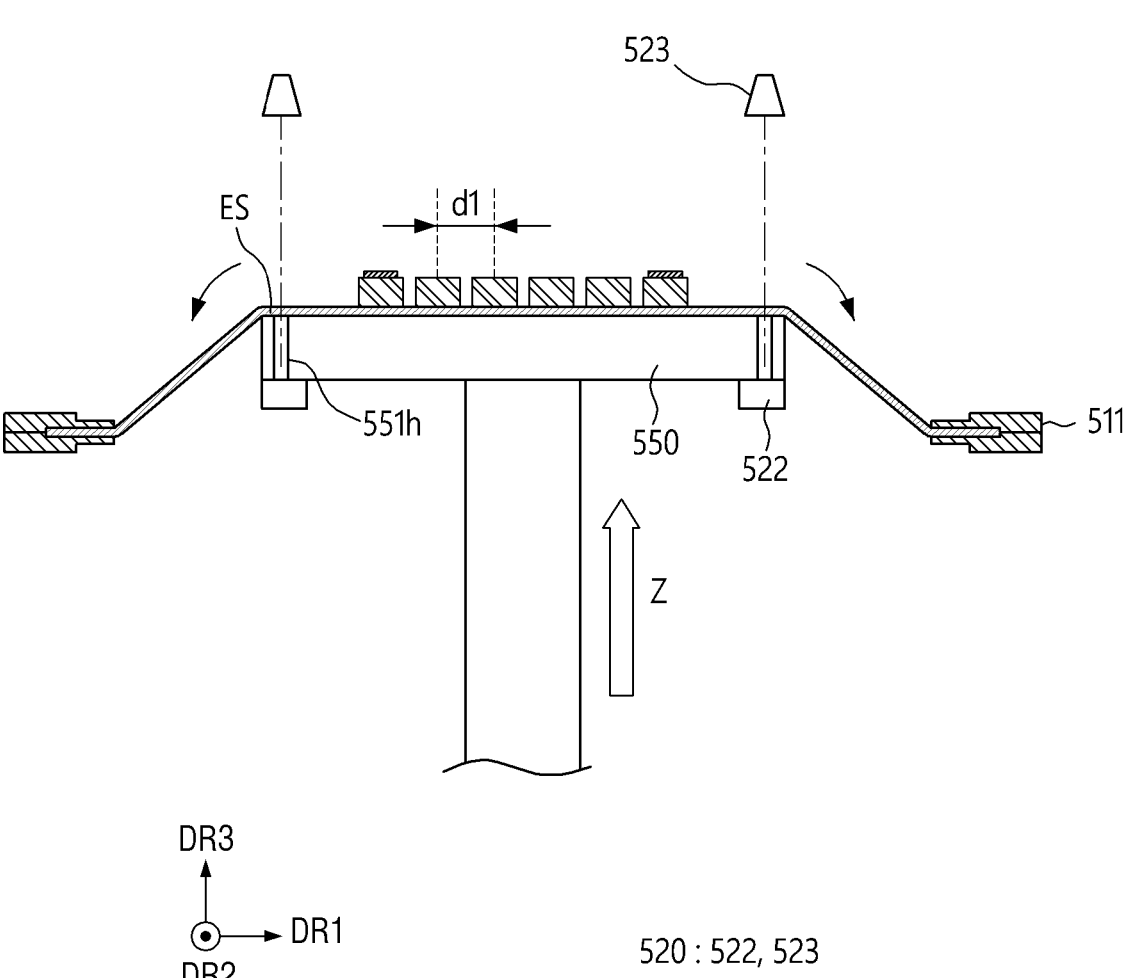
FIGS. 27 to 30 are cross-sectional and front views illustrating steps of a method of elongating a transfer fil.

Referring to FIG. 27, the amount of light reflected off the transfer film ES is monitored by the optical inspection member 520 (step S140 of FIG. 16. Subsequently, the width of the transfer film ES is elongated toward the outer circumference by the elongation processing member 550, while the degree of elongation is controlled based on the detection results by the optical inspection member 520 (step S150 in FIG. 16.

Figure 28:
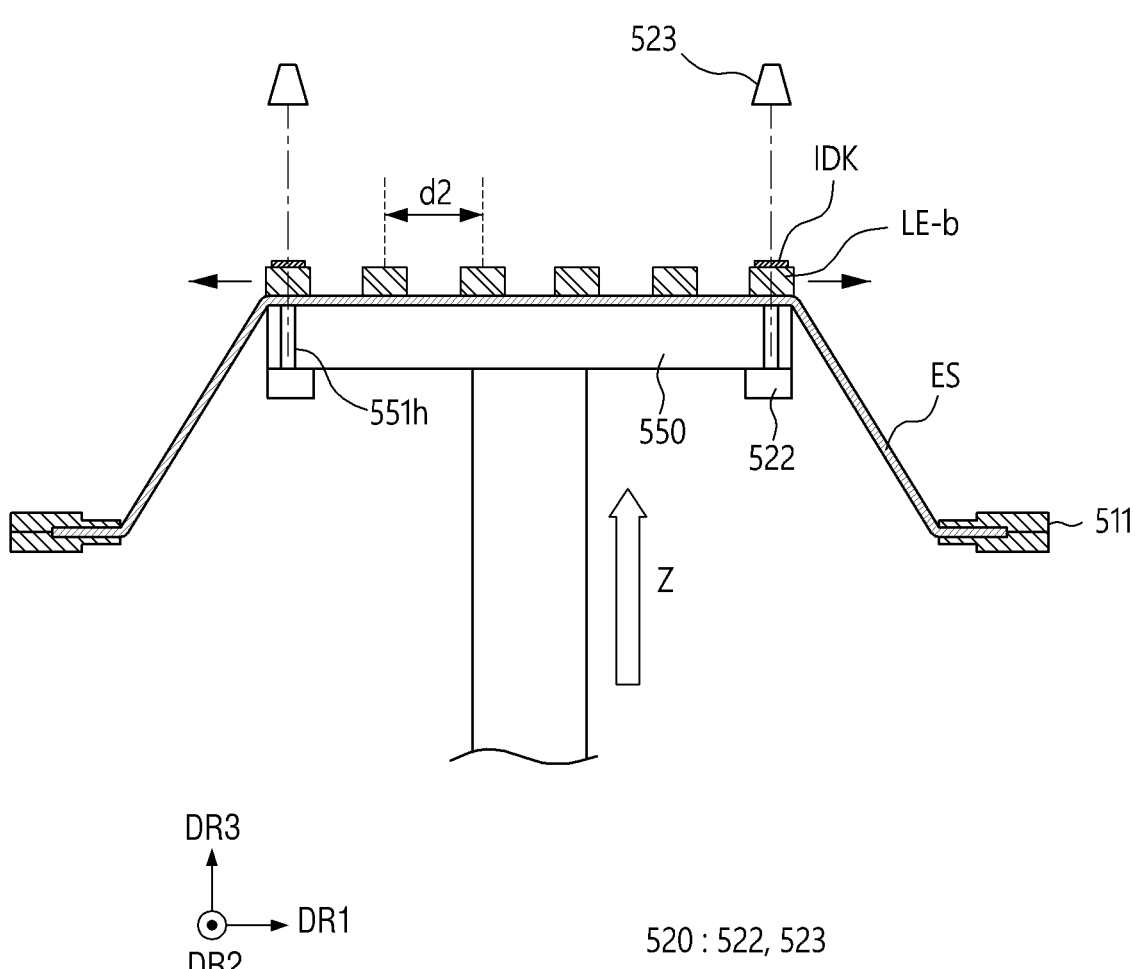

For example, the elongation processing member 550 presses the rear surface of the transfer film ES toward the front side of the transfer film ES while moving toward the rear surface of the transfer film ES (e.g., in the direction indicated by the Z-axis arrow. Accordingly, as shown in FIGS. 27 and 28, the transfer film ES is elongated due to the movement and pressing by the elongation processing member 55. The transfer film ES may be elongated two-dimensionally, including in the first direction DR1 and the second direction DR2.

As described above, second light-emitting elements LE-b having alignment keys IDK may be disposed at the outermost positions of the transfer film E.

Before the transfer film ES is elongated, the optical inspection member 520 may detect a first amount of light. A light-receiving sensor 522 of the optical inspection member 520 may receive the first amount of light that is irradiated from the light source 523 and transmitted the first transfer film ES.

As the transfer film ES is elongated, the second light-emitting elements LE-b at the outermost positions may be disposed along the optical paths of the optical inspection member 52.

When the second light-emitting elements LE-b are disposed on the optical paths, the optical inspection member 520 may detect a second amount of light. The light-receiving sensor 522 of the optical inspection member 520 may receive the second amount of light that is irradiated from the light source 523, transmitted the first transfer film ES, and are mostly reflected by the alignment keys ID. Therefore, the second amount of light is less than the first amount of light.

As the transfer film ES is elongated, the plurality of light-emitting elements LE attached to the transfer film ES may be spaced apart from one another by a second distance D. For example, the light-emitting elements LE may be uniformly spaced apart from one another by the second distance D2, which is greater than the first distance D.

The elongation processing member 550 may elongate the transfer film ES until the alignment keys IDK are located on (e.g., are aligned with) the through holes 551.

Figure 29:
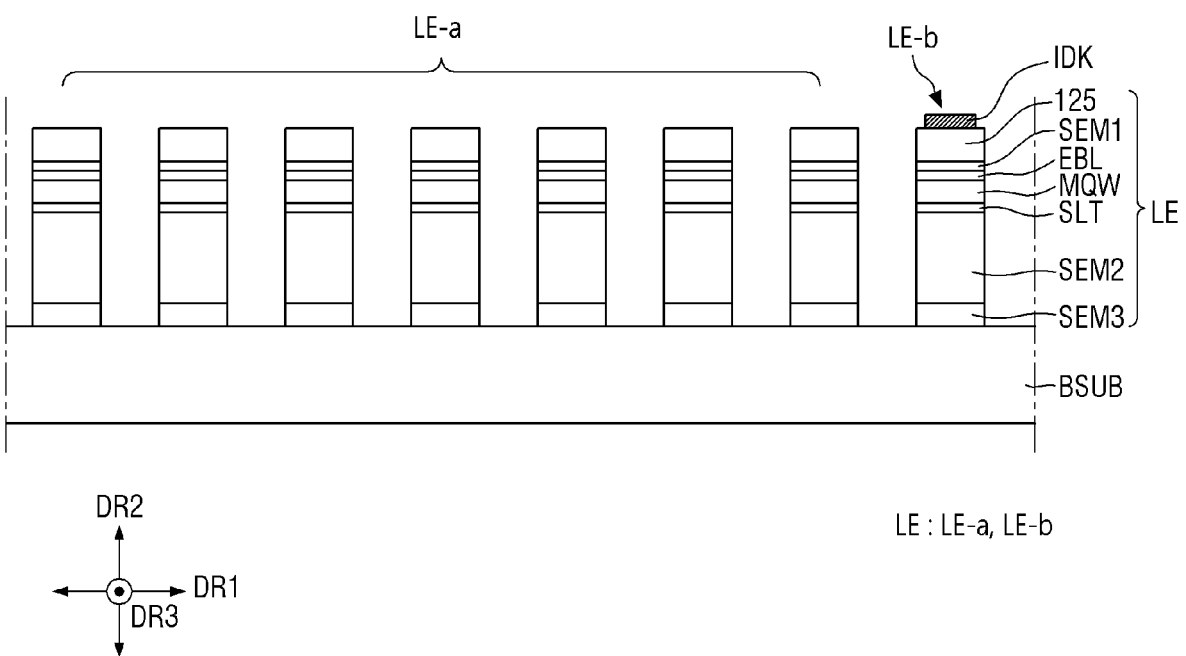
Figure 30:
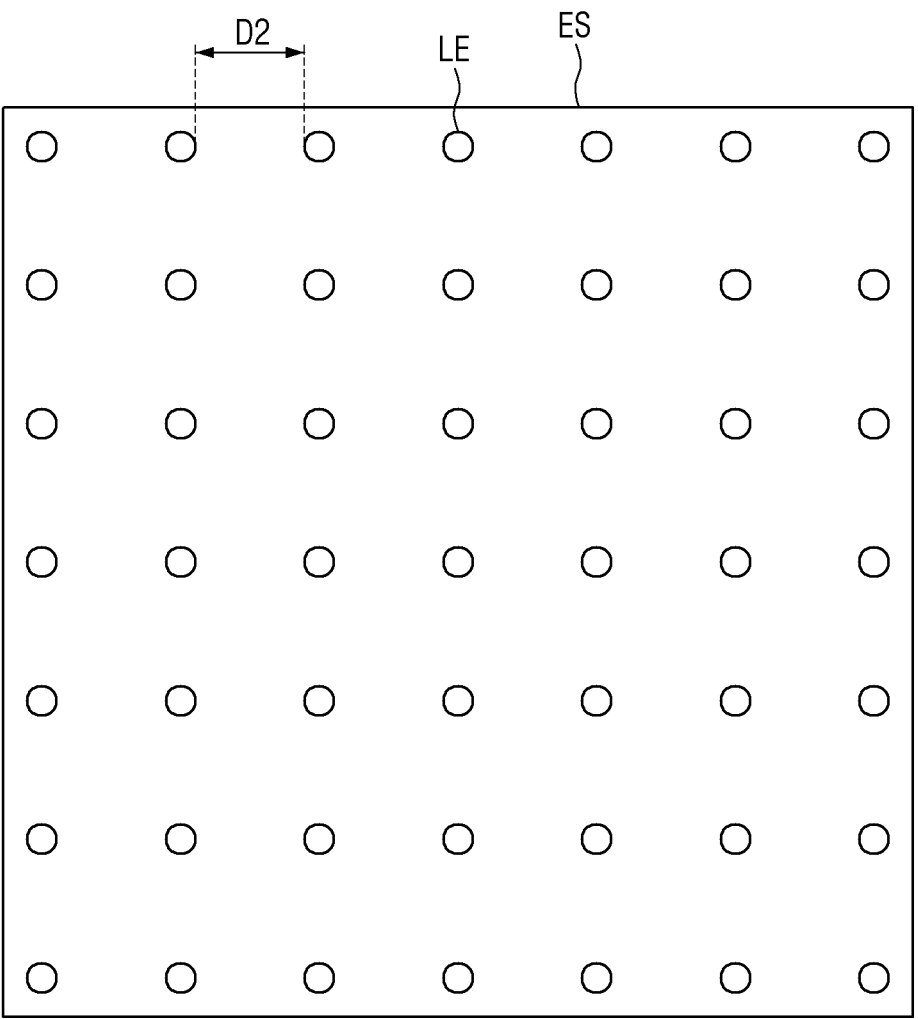
Figure 30:
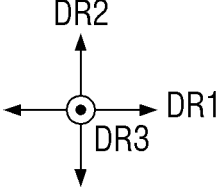

Referring to FIGS. 29 and 30, when the alignment keys IDK are located on the through holes 551h, the light-emitting elements LE may be arranged at the desired second distance D2. By inversely calculating this, the position of the through holes 551h may be obtained. In other words, the through holes 551h may be formed at such positions that the light-emitting elements LE are arranged at the desired second distance D.

Figure 31:
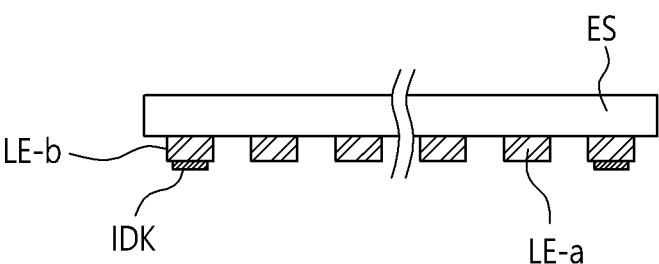
FIGS. 31 to 33 are cross-sectional views illustrating steps of a method of releasing the light-emitting elements on the transfer film and attaching them to the display panel.
Figure 31:
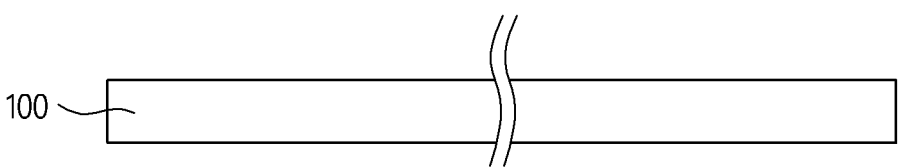
Figure 31:
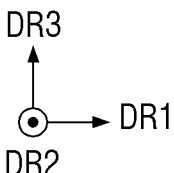
Figure 32:
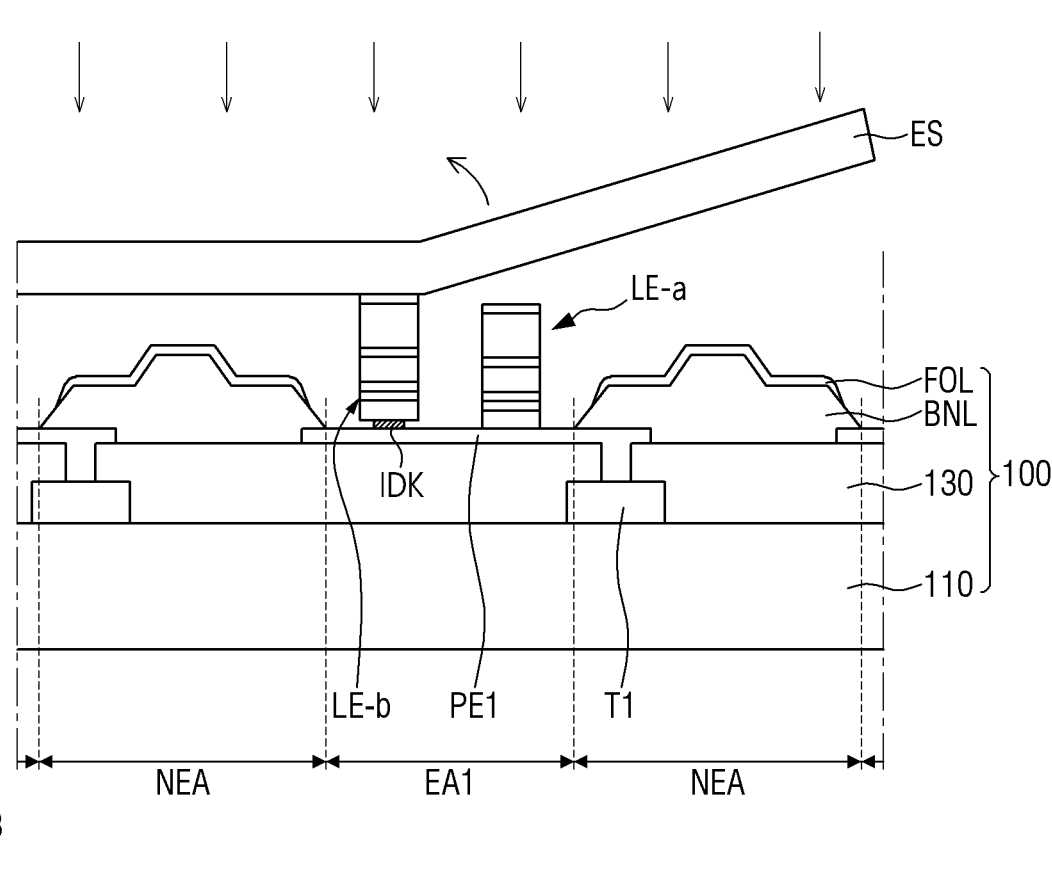
Figure 32:
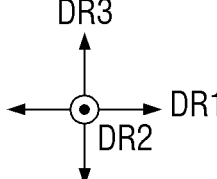
Figure 33:
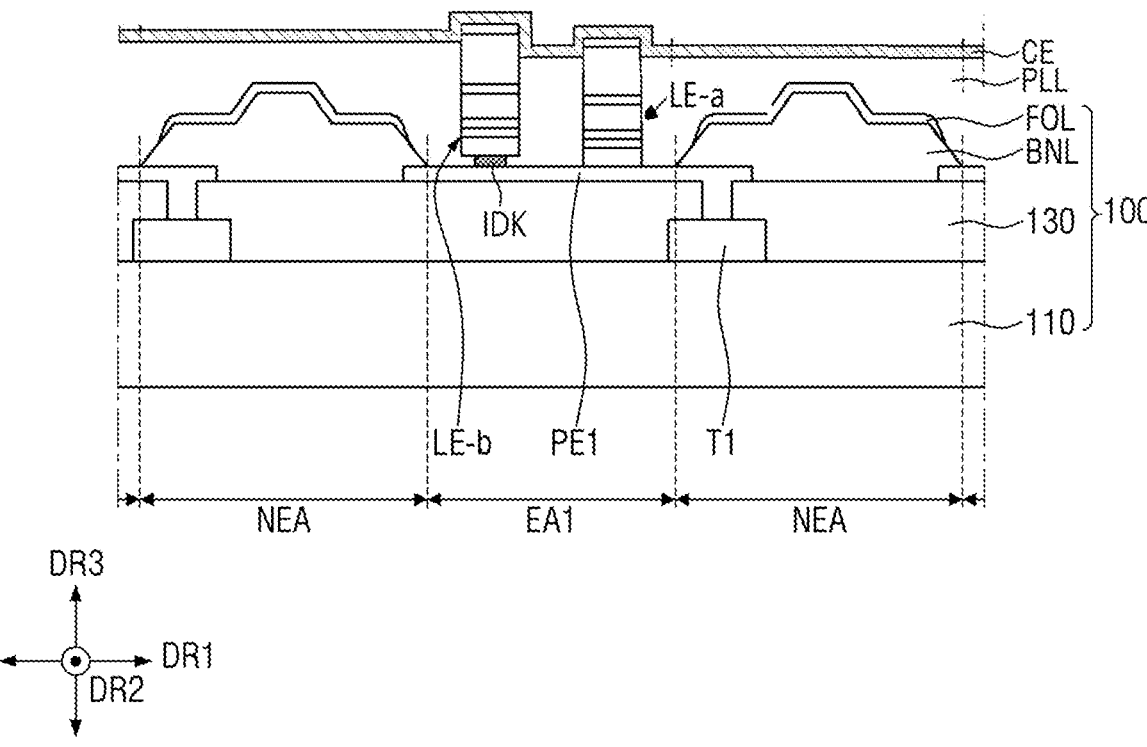

FIGS. 31 to 33 are cross-sectional views illustrating steps of a method of separating the light-emitting elements on the transfer film and attaching them to the display panel.

Referring to FIG. 31, the transfer film ES, on which the light-emitting elements LE are spaced apart from one another by the second distance D2, is attached to the display substrate 100 so that the light-emitting elements LE are attached to the display substrate 100 to fabricate the display device 10. Prior to the process of attaching the light-emitting elements LE to the display substrate 100, at least one of the transfer film ES and the display substrate 100 may be cut to fit the size or area of the product.

The connection electrodes 125 and the alignment keys IDK of the light-emitting elements LE formed on the transfer film ES are brought into contact with the first pixel electrode PE1 of the display substrate 10. Subsequently, the display substrate 100 and the transfer film ES are attached together by melting and bonding the connection electrodes 125 and the first pixel electrode PE1 at a temperature (e.g., a predetermined temperature. In doing so, the plurality of light-emitting elements LE is attached to the upper surface of the first pixel electrode PE. In particular, the connection electrodes 125 and the first pixel electrode PE1 are made of the same material, for example, ITO, the connection electrode 125 and the first pixel electrode PE1 may have excellent adhesive properties.

Subsequently, as shown in FIG. 32, ultraviolet ray or heat is applied to the transfer film ES to reduce the adhesive strength of the adhesive layer of the transfer film ES, and then the transfer film ES may be physically or naturally separated from the plurality of light-emitting elements L.

Subsequently, as shown in FIG. 33, a planarization layer PLL is formed on (or between) the plurality of light-emitting elements LE and on the pixel electrode PE1 and the first organic layer FOL, and a common electrode CE is formed on the planarization layer PL. The planarization layer PLL is formed to have a thickness smaller than the height of the light-emitting elements LE so that the second semiconductor layer SEM2 and the third semiconductor layer SEM3 of the light-emitting elements LE are exposed (e.g., so that the third semiconductor layer SEM3 is exposed and the second semiconductor layer SEM2 is at least partially exposed). Then, the common electrode CE is formed by depositing a transparent conductive material on the planarization layer PL. The common electrode CE is formed to cover the light-emitting elements LE and the planarization layer PL. The common electrode CE is in contact with the second semiconductor layer SEM2 and the third semiconductor layer SEM3 of each of the light-emitting elements LE, which are exposed from (or exposed through) the planarization layer PLL.

Figure 34:
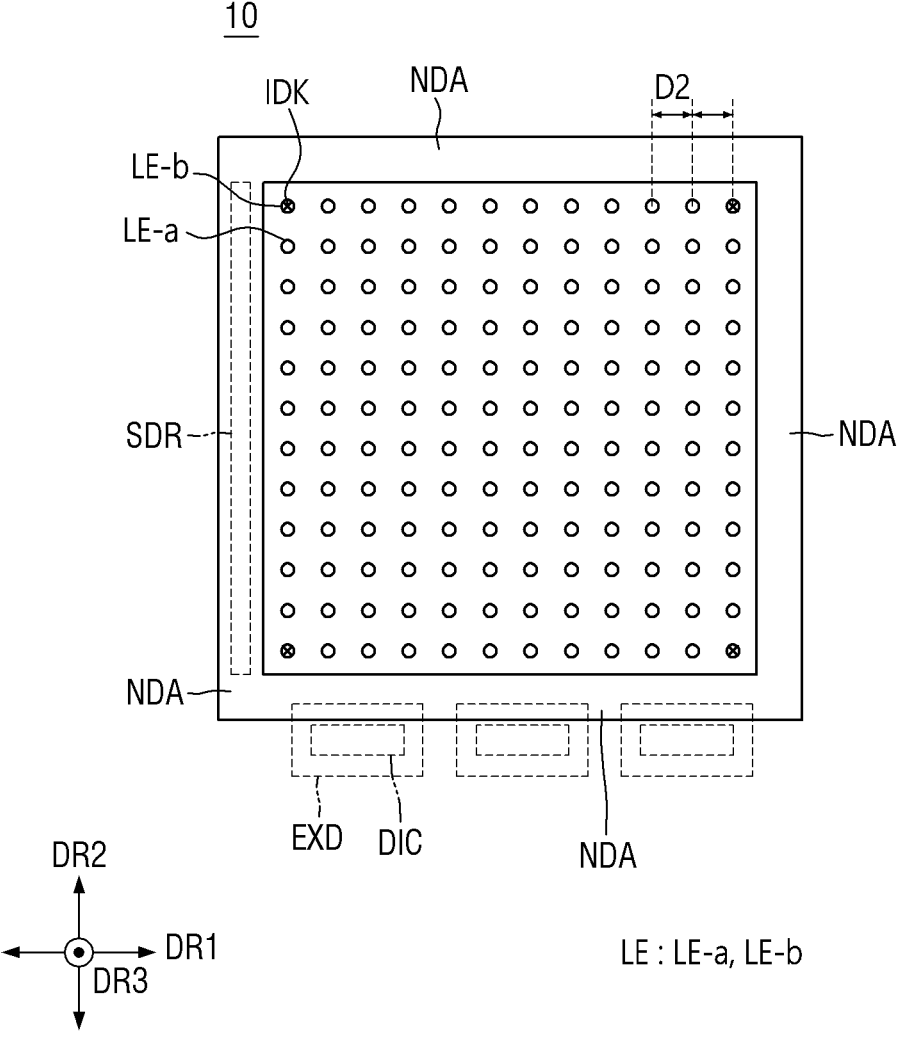
FIG. 34 is a plan view of a display panel according to an embodiment of the present disclosure.
Figure 35:
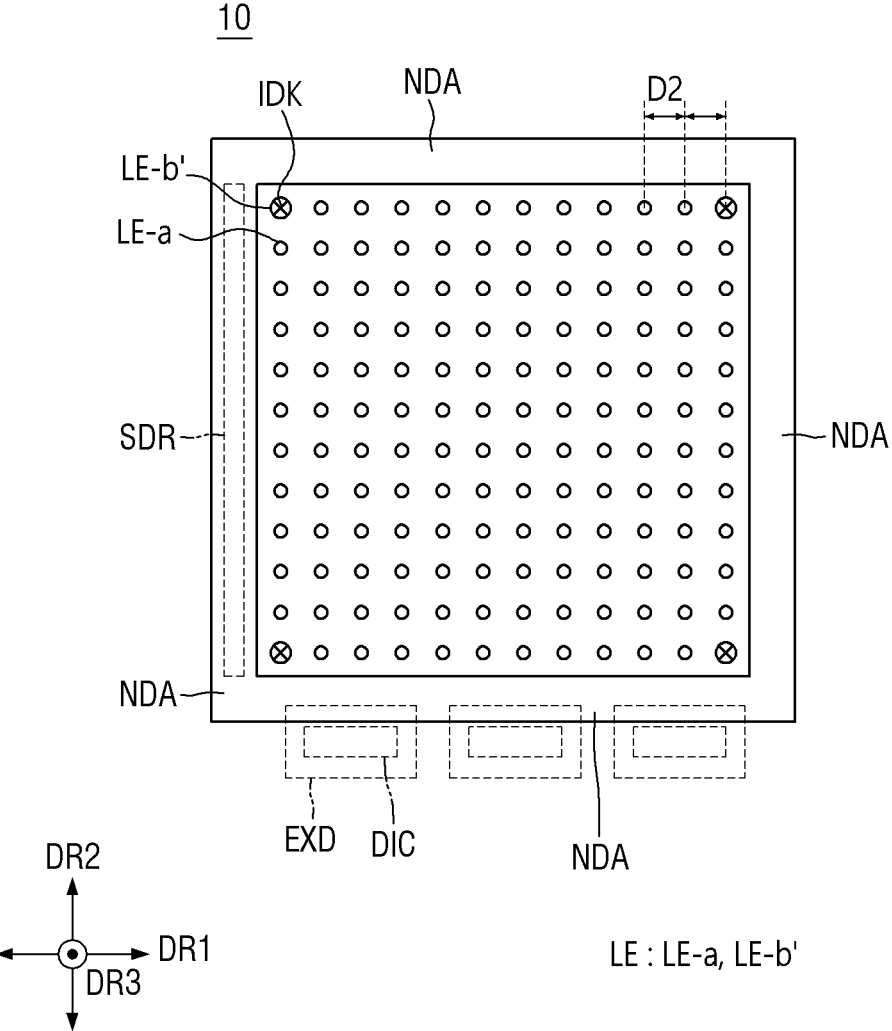
FIG. 35 is a plan view of a display panel according to another embodiment of the present disclosure.

FIG. 34 is a plan view of a display panel according to an embodiment of the present disclosure. FIG. 35 is a plan view of a display panel according to another embodiment of the present disclosure.

As shown in FIG. 34, a plurality of light-emitting elements LE may be arranged in the display area DPA of the display pane. The light-emitting elements LE include first light-emitting elements LE-a and second light-emitting elements LE-. The second light-emitting elements LE-b are different from the first light-emitting elements LE-a because the former have the alignment keys IDK. The first light-emitting elements LE-a and the second light-emitting elements LE-b are substantially identical except for the alignment keys IDK. Each of the first light-emitting elements LE-a is formed such that a second semiconductor layer, an active layer, a first semiconductor layer, and a connection electrode are sequentially stacked on one another, and each of the second light-emitting elements LE-b is formed such that the second semiconductor layer, the active layer, the first semiconductor layer, the connection electrode, and the alignment key IDK are sequentially stacked on one another.

As described above with reference to FIGS. 7 and 18, the alignment keys IDK have conductivity and a reflectivity higher than that of the connection electrodes.

The number of second light-emitting elements LE-b may be less than the number of first light-emitting elements LE-a on the display pane. At least two surfaces of each of the second light-emitting elements LE-b may be surrounded by the first light-emitting elements LE-.

In addition, as shown in FIG. 35, the width of the second light-emitting elements LE-b' may be greater than that of the first light-emitting elements LE-. The embodiment shown in FIG. 35 is substantially identical to the embodiment shown in FIG. 34 except for the width of the second light-emitting elements LE-b and, therefore, the redundant descriptions therebetween may be omitted.

According to an apparatus and method for fabricating a display panel according to embodiments of the present disclosure, the light-emitting elements may be precisely and accurately arrange at a desired distance therebetween.

However, aspects and features of the present disclosure are not limited to those explicitly described herein. The above and other aspects and features of the present disclosure will become more apparent to one of ordinary skill in the art to which the present disclosure pertains by referencing the claims, with equivalents thereof to be included therein.

What is claimed is:

1. An apparatus for fabricating a display panel, the apparatus comprising:

a fixing frame for fixing an outer circumference of a transfer film on which a plurality of light-emitting elements is arranged;

an optical inspection member comprising a light source for irradiating light toward the transfer film and a light-receiving sensor in an optical path of the light source; and an elongation processing member for elongating a width of the transfer film toward an outer circumference thereof and for controlling a degree of elongation based on detection results by the optical inspection member, wherein the light-emitting elements comprise first light-emitting elements and second light-emitting elements, and wherein the second light-emitting elements comprise alignment keys on one side.

2. The apparatus of claim 1, wherein the elongation processing member comprises:

a plate-shaped frame on which the transfer film is arranged; and a transfer mechanism for supporting a rear surface of the plate-shaped frame and for moving the plate-shaped frame toward a front side or a rear side of the plate-shaped frame.

3. The apparatus of claim 2, wherein the plate-shaped frame comprises a through hole from one surface to an opposite surface thereof, wherein the optical inspection member forms an optical path on the same axis as the through hole, and wherein the light source and the light-receiving sensor are arranged with the through hole therebetween.

4. The apparatus of claim 3, wherein the elongation processing member is configured to elongates the transfer film until the second light-emitting elements on the transfer film are located on a same axis as the through hole based on inspection results of the optical inspection member.

5. The apparatus of claim 2, further comprising a film mount for fixing a position of the fixing frame during elongation of the transfer film by the elongation processing member by pressing the fixing frame.

6. The apparatus of claim 1, wherein each of the second light-emitting elements has a second semiconductor layer, an active layer, a first semiconductor layer, a connection electrode, and an alignment key sequentially stacked on one another in this order.

7. The apparatus of claim 6, wherein the alignment key has conductivity and a reflectivity higher than that of the connection electrode.

8. The apparatus of claim 1, wherein a width of the second light-emitting elements is equal to or greater than a width of the first light-emitting elements.

9. The apparatus of claim 1, wherein the second light-emitting elements are at least partially surrounded by the first light-emitting elements.

10. The apparatus of claim 1, wherein a number of the second light-emitting elements is less than a number of the first light-emitting elements.

11. A method for fabricating a display panel, the method comprising:

forming a plurality of light-emitting elements on a base substrate, the light-emitting elements comprising first light-emitting elements and second light-emitting elements, the second light-emitting elements comprising alignment keys formed on one side;

transferring and attaching the plurality of light-emitting elements to a transfer film;

disposing the transfer film on a plate-shaped frame of an elongation processing member by fixing an outer circumference of the transfer film on which the plurality of light-emitting elements is attached with a fixing frame;

monitoring an amount of light reflected from the transfer film by an optical inspection member; and elongating a width of the transfer film toward the outer circumference thereof by the elongation processing member while controlling a degree of elongation based on detection results by the optical inspection member.

12. The method of claim 11, further comprising:

preparing a display substrate comprising pixel circuits and pixel electrodes; and disposing the light-emitting elements spaced apart from one another by a distance varying according to an elongation amount of the transfer film on the pixel electrodes of the display substrate.

13. The method of claim 11, wherein the elongation processing member elongates the transfer film until the second light-emitting elements are positioned along an optical path of the optical inspection member.

14. The method of claim 11, wherein the forming of the light-emitting elements comprises:

forming the first light-emitting elements in each of which a second semiconductor layer, an active layer, a first semiconductor layer, and a connection electrode are sequentially stacked on the base substrate; and forming the second light-emitting elements in each of which the second semiconductor layer, the active layer, the first semiconductor layer, the connection electrode, and an alignment key are sequentially stacked on the base substrate.

15. The method of claim 14, wherein the alignment key has conductivity and a reflectivity higher than that of the connection electrode.

16. The method of claim 14, wherein a width of the second light-emitting elements is equal to or greater than a width of the first light-emitting elements.

17. A display panel comprising:

a support substrate comprising pixel circuits and pixel electrodes; and a plurality of light-emitting elements on the pixel electrodes, the plurality of light-emitting elements comprising first light-emitting elements and second light-emitting elements, the second light-emitting elements comprising alignment keys on one side thereof.

18. The display panel of claim 17, wherein each of the second light-emitting elements comprises a second semiconductor layer, an active layer, a first semiconductor layer, a connection electrode, and one of the alignment keys sequentially stacked on one another in this order.

19. The display panel of claim 18, wherein the alignment keys have conductivity and a reflectivity higher than that of the connection electrode.

20. The display panel of claim 17, wherein a width of the second light-emitting elements is equal to or greater than a width of the first light-emitting elements.

21. The display panel of claim 17, wherein the second light-emitting elements are at least partially surrounded by the first light-emitting elements.

22. The display panel of claim 17, wherein a number of the second light-emitting elements is less than a number of the first light-emitting elements.

\* \* \* \* \*